(12) United States Patent
Kim et al.

(10) Patent No.: US 11,006,534 B2
(45) Date of Patent: May 11, 2021

(54) TILED DISPLAY AND METHOD OF ASSEMBLING THE SAME

(71) Applicant: LG Display Co., Ltd., Seoul (KR)

(72) Inventors: HanSeok Kim, Paju-si (KR); YoungHo Kim, Gwangju (KR); SeungChul Lee, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/705,202

(22) Filed: Dec. 5, 2019

(65) Prior Publication Data

US 2020/0196462 A1    Jun. 18, 2020

(30) Foreign Application Priority Data

Dec. 13, 2018  (KR) ........................ 10-2018-0160765

(51) Int. Cl.
*H05K 5/00*   (2006.01)
*B23Q 3/15*   (2006.01)
*H05K 5/03*   (2006.01)

(52) U.S. Cl.
CPC ............. *H05K 5/0021* (2013.01); *B23Q 3/15* (2013.01); *H05K 5/0017* (2013.01); *H05K 5/03* (2013.01)

(58) Field of Classification Search
USPC .................................................. 361/810, 730
See application file for complete search history.

(56) References Cited

U.S. PATENT DOCUMENTS

| 6,707,360 | B2* | 3/2004 | Underwood | H01F 7/04 |
| | | | | 335/288 |
| 10,330,979 | B2 | 6/2019 | Ryu et al. | |
| 10,522,519 | B2* | 12/2019 | Ryu | G09F 9/3026 |
| 2018/0031919 | A1 | 2/2018 | Ryu et al. | |
| 2019/0037712 | A1* | 1/2019 | Kim | H05K 5/0017 |
| 2019/0057799 | A1* | 2/2019 | Habeck | H05K 5/0017 |
| 2019/0208655 | A1* | 7/2019 | Schafer | G09F 9/33 |

FOREIGN PATENT DOCUMENTS

| JP | 6425858 B1 | 11/2018 |
| KR | 10-2016-0109728 A | 9/2016 |
| KR | 10-2018-0011983 A | 2/2018 |
| KR | 10-1895522 B1 | 10/2018 |

OTHER PUBLICATIONS

European Patent Office, Extended European Search Report and Opinion, EP Patent Application No. 19215095.1, dated Apr. 17, 2020, ten pages.

\* cited by examiner

*Primary Examiner* — Hung S. Bui
(74) *Attorney, Agent, or Firm* — Fenwick & West LLP

(57) ABSTRACT

There is provided a tiled display including: a plurality of display devices; a plurality of first magnets in contact with a surface of each of the display devices; a wall portion configured to be attached to and detached from the display devices; and a plurality of second magnets disposed on a surface of the wall portion and in line with the first magnets. The second magnets are movable in a direction perpendicular to or intersecting the surface of the wall portion. Accordingly, it is possible to attach/release the plurality of display devices to/from the wall portion by forming an attractive force or a repulsive force between the first magnets and the second magnets.

19 Claims, 22 Drawing Sheets

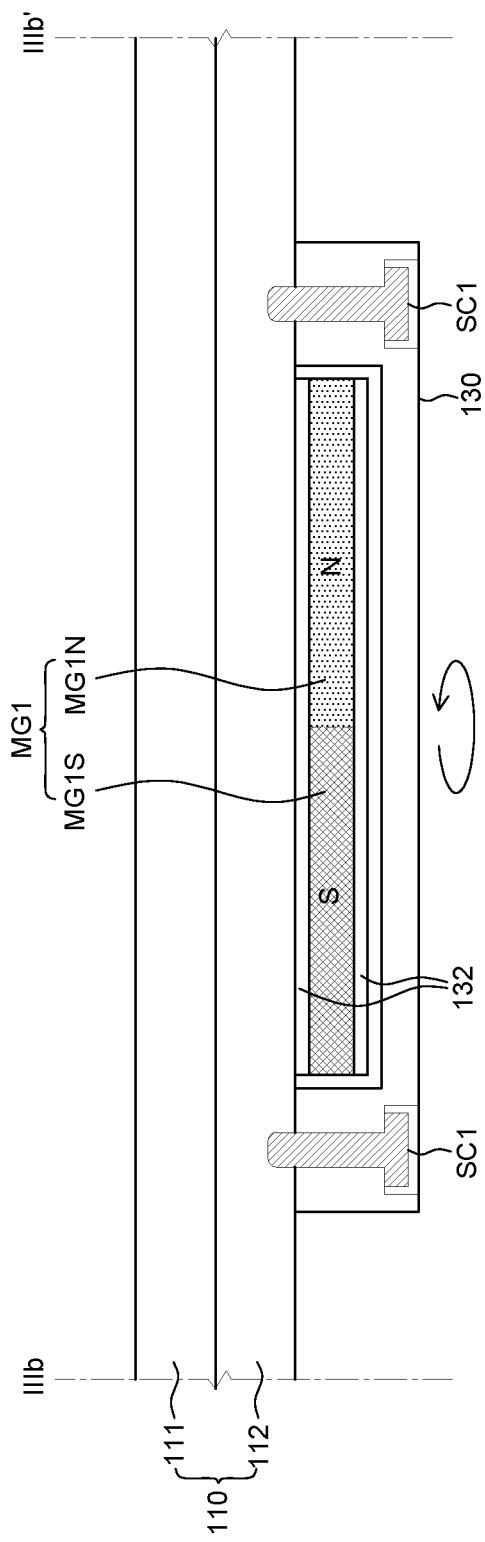

TILED DISPLAY AND METHOD OF ASSEMBLING THE SAME

CROSS-REFERENCE TO RELATED APPLICATION

This application claims priority to Republic of Korea Patent Application No. 10-2018-0160765, filed on Dec. 13, 2018, which is incorporated herein by reference in its entirety for all purposes.

BACKGROUND

Technical Field

The present disclosure relates to a tiled display and a method of assembling the tiled display, and more particularly, to a tiled display that is implemented by fastening a plurality of display devices to a wall portion from the front of the display devices, and a method of assembling the tiled display.

Description of the Related Art

Display devices employed by the monitor of a computer, a TV, a mobile phone, or the like include an organic light-emitting display (OLED) that emits light by itself, and a liquid-crystal display (LCD) that requires a separate light source.

Such display devices find more and more applications, including computer monitors and televisions, as well as personal portable devices. Accordingly, research is ongoing to develop display devices having a larger display area with reduced volume and weight.

Recently, a tiled display having a large display area is used as a billboard or the like, which is implemented by connecting a plurality of display devices each including a display panel with one another.

SUMMARY

Display devices are employed in a small-sized electronic device such as mobile phones, and in a large-sized electronic device such as large TVs. As such, display devices are fabricated from a small size to a large size, e.g., several tens of inches, for a variety of applications. However, it is technically difficult to fabricate a display device with a large size of several hundred inches or more. Instead, a tiled display implemented by connecting a plurality of display devices with one another to increase the display area is used. In addition, a tiled display including a plurality of display devices may be used as a billboard by attaching it to a wall, or may be used as a large billboard in a stadium or an outdoor advertisement billboard.

Such a tiled display may be implemented by fastening a plurality of display devices to a wall in the form of tiles. The plurality of display devices may be attached as close to one another as possible so that the plurality of displays is perceived as a single display. That is to say, the plurality of display devices may be precisely aligned and attached to the wall portion, so that the boundaries between the display devices where no image is displayed can be reduced. If the display devices are misaligned in one or more of the x-axis direction, the y-axis direction, and the z-axis direction, the boundaries between the display devices where no image is displayed may be observed by a viewer. Such boundaries can disturb the viewer's immersion into the images, and it may be difficult to realize clear images.

Therefore, it is important to align the display devices in each of the x-axis direction, the y-axis direction, and the z-axis direction when the display devices are attached to the wall. To attach the display devices to the wall portion, fastening members are disposed on the position of a wall portion where the display devices are to be attached, and then the display devices are attached to the wall portion by using the fastening members. By doing so, the display devices are aligned preliminarily. The display devices may be slightly misaligned due to machining tolerances of the components, tolerances of the wall portion, and/or adhesion tolerances of the plurality of display devices.

If there are deviations in the alignment of the display devices, the boundaries between the display devices where no image is displayed may be observed, such that the quality of the image may be deteriorated. In view of the above, if the spacing and/or alignment between the display devices are not precisely aligned, the boundaries between the display devices may be observed, which can disturb a viewer's watching.

When the display devices are fastened to the wall portion, if the spacing between the display devices is larger than a certain level, the boundaries between the display devices may be observed. To avoid the boundaries between the display devices from being observed, the display devices are arranged such that their edges are as close to one another as possible at a regular spacing. An operator may fasten the back side of the display devices to the wall portion from the behind of the display devices. In a conventional process, the operator fastens the display devices to the wall portion from the behind of the display devices, so it is difficult for the operator to check in real-time the spacing, alignment, and the like between the display devices, which can be seen from the front of the display devices. In view of the above, it is difficult to check the arrangement and spacing between the display devices in real-time when the fastening operation is performed from the behind of the display devices and wall portion.

The present disclosure provides a method by which a plurality of display devices can be easily connected to a wall portion from the front of the display devices and the spacing and misalignment can be easily adjusted.

An object of the present disclosure is to provide a tiled display capable of easily adjusting the spacing and/or alignment between a plurality of display devices attached to a wall portion regardless of various tolerances.

Another object of the present disclosure is to provide a tiled display capable of fastening a plurality of display devices to a wall portion behind the display devices from the front of the display devices.

Another object of the present disclosure is to provide a tiled display capable of checking in real-time locations of the display devices from the front thereof to fasten the display devices.

Another object of the present disclosure is to provide a tiled display allowing each of display devices attached to a wall portion to be easily replaced and reassembled.

Another object of the present disclosure is to provide a tiled display capable of reducing a time taken for fastening each of display devices to a wall portion.

Another object of the present disclosure is to provide a tiled display capable of reducing an impact exerted to display devices when the display devices are attached to a wall portion.

Another object of the present disclosure is to provide a tiled display having a simpler mechanism for fastening a plurality of display devices to a wall portion.

Objects of the present disclosure are not limited to the above-mentioned objects, and other objects, which are not mentioned above, can be clearly understood by those skilled in the art from the following descriptions.

According to an aspect of the present disclosure, there is provided a tiled display including: a plurality of display devices; a plurality of first magnets on the plurality of the display devices; a wall portion to which the plurality of display devices are attached; and a plurality of second magnets disposed on the wall portion each aligned with a corresponding one of the plurality of first magnets. The plurality of second magnets are movable in a direction perpendicular to or intersecting a surface of the wall portion. Accordingly, it is possible to attach and/or release the plurality of display devices to and/or from the wall portion by forming an attractive force or a repulsive force between the plurality of first magnets and the plurality of second magnets.

According to another aspect of the present disclosure, there is provided a tiling tool including: a magnet; a cover accommodating the magnet therein; and a rotation lever configured to rotate the magnet, wherein the rotation lever is configured to rotate along a circumferential direction of the cover to rotate the magnet. Therefore, it is possible to attach/release a plurality of display devices to/from the wall portion by rotating the magnet of the tiling tool, allow for easy operation of the tiling tool.

According to another aspect of the present disclosure, there is provided a method of assembling a tiled display, the method including: attaching a tiling tool accommodating a third magnet to a front face of a display device having a first magnet disposed on a rear face of the display device; attaching the tiling tool and the display device to a wall portion having a second magnet disposed therein such that an N-pole of the first magnet overlaps with an S-pole of the third magnet; and releasing the tiling tool from the front face of the display device. Since the display devices can be attached to the wall portion from the front thereof, it is possible to check in real-time the locations of the display devices and to align the display devices precisely.

Other detailed matters of the exemplary embodiments are included in the detailed description and the drawings.

According to an exemplary embodiment of the present disclosure, it is possible to easily adjust deviations in the spacing and/or misalignment between the display devices.

According to an exemplary embodiment of the present disclosure, it is possible to adjust the arrangement of each of the display devices from the front of the display devices.

According to an exemplary embodiment of the present disclosure, each of the display devices can be installed and maintained easily in a tiled display.

According to an exemplary embodiment of the present disclosure, the spacing between a plurality of display devices can be reduced, so that it is possible to prevent image quality from deteriorating due to the boundaries between the display devices.

According to an exemplary embodiment of the present disclosure, it is possible to align a plurality of display devices irrespectively of a variety of tolerances such as machining tolerances of the components, tolerances of the wall portion, and/or adhesion tolerances of the plurality of display devices.

According to an exemplary embodiment of the present disclosure, it is possible to reduce misalignment between a plurality of display devices by checking in real-time the locations of the display devices when the display devices are fastened to the wall portion.

According to an exemplary embodiment of the present disclosure, it is possible to easily dissemble and reassemble one of a plurality of display devices at a time that is required to be repaired or replaced.

According to an exemplary embodiment of the present disclosure, it is possible to reduce a time taken for fastening a plurality of display devices to the wall portion.

According to an exemplary embodiment of the present disclosure, it is possible to reduce an impact exerted to a plurality of display devices when the display devices are fastened to the wall portion.

According to an exemplary embodiment of the present disclosure, it is possible to reduce cost by employing a mechanism with fewer parts than a conventional mechanism for fastening a plurality of display devices to the wall portion.

The effects according to the present disclosure are not limited to the contents exemplified above, and more various effects are included in the present specification.

BRIEF DESCRIPTION OF THE DRAWINGS

The above and other aspects, features, and other advantages of the present disclosure will be more clearly understood from the following detailed description taken in conjunction with the accompanying drawings, in which:

FIG. 3B is a cross-sectional view of the tiled display taken along line IIIb-IIIb' of FIG. 2.

DETAILED DESCRIPTION

Figure 1A:
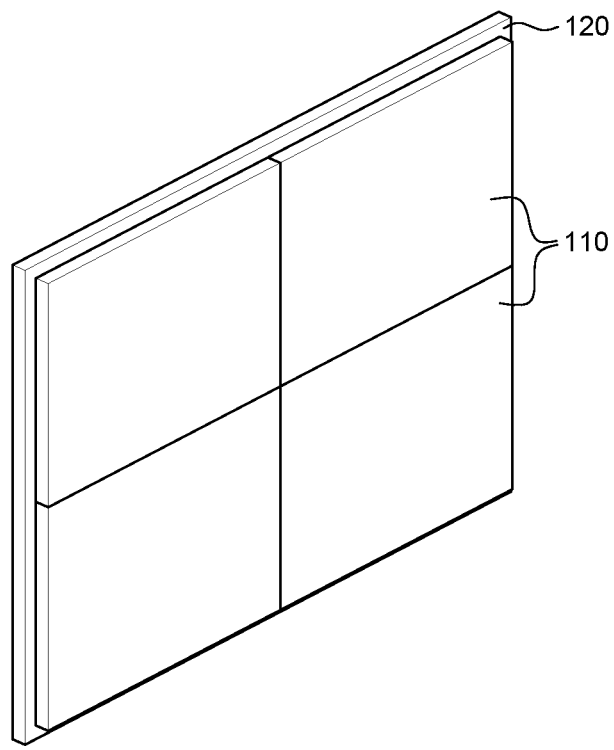
FIGS. 1A and 1B are perspective views of a tiling display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly".

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a tiled display according to exemplary embodiments of the present disclosure will be described in detail with reference to accompanying drawings.

Figure 1B:
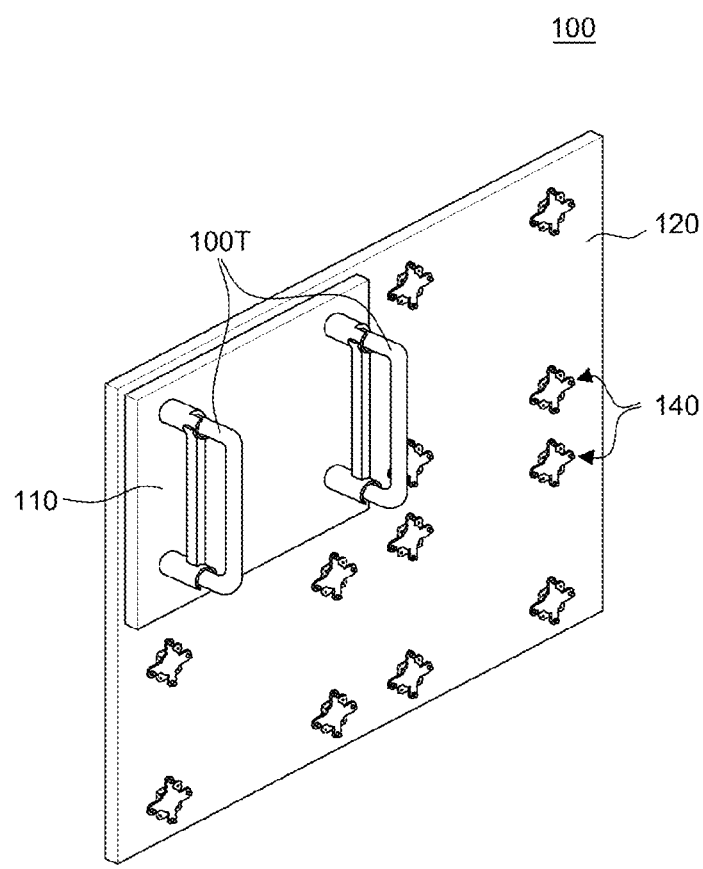

FIGS. 1A and 1B are perspective views of a tiled display according to an exemplary embodiment of the present disclosure. FIG. 1A is a schematic perspective view of a tiled display 100 according to an exemplary embodiment of the present disclosure. FIG. 1B is a schematic perspective view for illustrating a process of assembling the tiled display 100 according to an exemplary embodiment of the present disclosure.

Referring to FIG. 1A, the tiled display 100 according to the exemplary embodiment of the present disclosure includes a plurality of display devices 110 and a wall portion 120. The tiled display 100 includes a plurality of display devices 110 in order to achieve a large display area where images are displayed.

The display devices 110 are attached to the wall portion 120 and arranged as if they were a single display device. For example, the tiled display 100 may be implemented by attaching the display devices 110 to the wall portion 120 in the form of tiles.

Although the tiled display 100 shown in FIG. 1A includes four display devices 110 for convenience of illustration, the number of the display devices 110 is not limited to four. The tiled display 100 can include any number or arrangement (e.g., rows or columns) of display devices 110.

The wall portion 120 is a member for supporting the plurality of display devices 110 and may serve as a frame of the tiled display 100. The display devices 110 may be secured to the wall portion 120. The wall portion 120 may be installed at a location where the tiled display 100 is to be installed. The tiled display 100 may be implemented by fixing the display devices 110 to the wall portion 120. For example, the wall portion 120 may be a case forming the tiled display 100, a case forming an electric board or the like, or a member formed on a wall or the wall itself. It is, however, to be understood that the present disclosure is not limited thereto.

Referring to FIGS. 1A and 1B, the wall portion 120 may have a size equal to or greater than that of the plurality of display devices 110. Although not shown in the drawings, various kinds of wires and cables for electrically connecting the plurality of display devices 110 may be disposed on the wall portion 120, and the plurality of the display devices 110 may be driven as a single display device. In some embodiments, the plurality of display devices 110 may be electrically connected with one another by wireless communications without a separate wiring or a cable.

Referring to FIG. 1B, the tiled display 100 may be manufactured by attaching each of the plurality of display devices 110 to the wall portion 120 from the front of the display devices 110 by using a tiling tool 100T. Specifically, the display devices 110 may be fixed to the wall portion 120 using the tiling tool 100T. For example, an operator may attach the tiling tool 100T to the front of each of the plurality of display devices 110 (e.g., one display device 110 at a time) and then grip the tiling tool 100T to move the display devices 110. After the tiling tools 100T and the display devices 110 are brought into contact with the wall portion 120, the display devices 110 may be fixed to the wall portion 120 by operating the tiling tools 100T. The display devices 110 may be fixed to the wall portion 120 by a second magnet of a second cover 140 of the wall portion 120. The second cover 140 will be described in more detail with reference to FIGS. 4 to 5C, and the tiling tools 100T will be described later in detail with reference to FIGS. 6A to 6C.

The plurality of display devices 110 may be attached as close to one another as possible so that they are perceived by a viewer as a single display device. That is to say, the plurality of display devices 110 can be precisely aligned and attached to the wall portion 120, so that the boundaries between the display devices 110 where no image is displayed can be reduced.

Each of the plurality of display devices 110 can be attached to the wall portion 120 by aligning them in the x-axis direction, the y-axis direction, and the z-axis direction. The plurality of display devices 110 may be aligned in the x-axis direction by aligning the left edges and the right edges of the display devices 110 arranged in a column so that they are on a straight line. The plurality of display devices 110 may be aligned in the y-axis direction by aligning the upper edges and the lower edges of the display devices 110 arranged in a row so that they are on a straight line. The plurality of display devices 110 may be aligned in the z-axis direction so that the all of the front faces of the display devices 110 are on a same plane in order to eliminate or reduce level differences between the display devices 110.

If the display devices 110 are misaligned in one or more of the x-axis direction, the y-axis direction, and the z-axis direction, the boundaries between the display devices 110 where no image is displayed may be observed by a viewer. Such boundaries can disturb the viewer's immersion into the images, and it may be difficult to realize clear images.

Therefore, it is important to align the display devices 110 in each of the x-axis direction, the y-axis direction, and the z-axis direction when the display devices 110 are attached to the wall portion 120. As fastening members are disposed to the wall portion 120 where the display devices 110 are to be attached and then the display devices 110 are fixed to the wall portion 120 by using the fastening members, it is possible to preliminarily align the locations of the display devices 110 with one another. However, there may be slight misalignment due to machining tolerances of the components, tolerances of the wall portion 120, and/or adhesion tolerances of the plurality of display devices 110. The tiled display 100 according to an exemplary embodiment can precisely align the plurality of display devices 110 by adjusting even slight deviations in the x-axis direction and y-axis direction irrespectively of a variety of tolerances, to fasten the display device 110 to the wall portion 120.

Hereinafter, the plurality of display devices 110, a first magnet MG1, and a first cover 130 forming the tiled display 100 will be described in detail with reference to FIGS. 2 to 3B.

Figure 2:
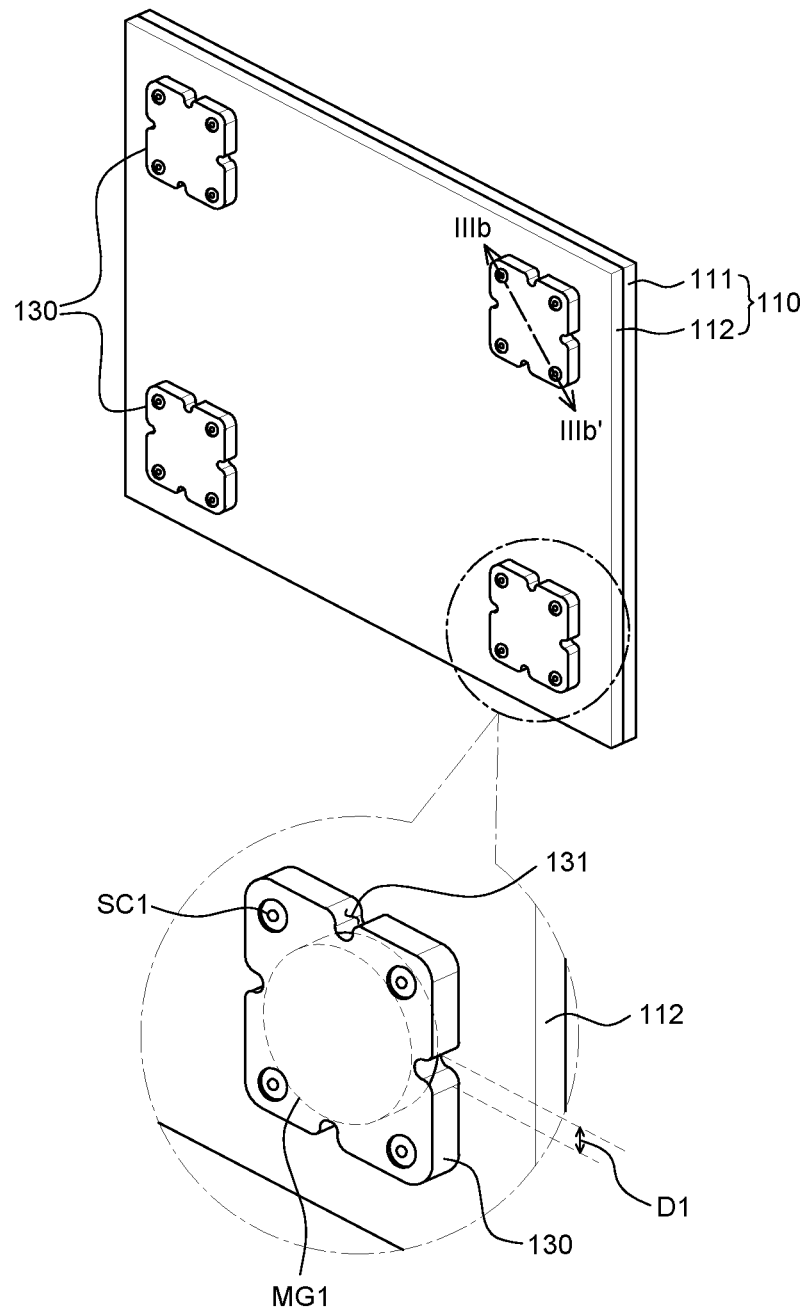
FIG. 2 is a perspective view of a display device of a tiled display according to an exemplary embodiment of the present disclosure.
Figure 3A:
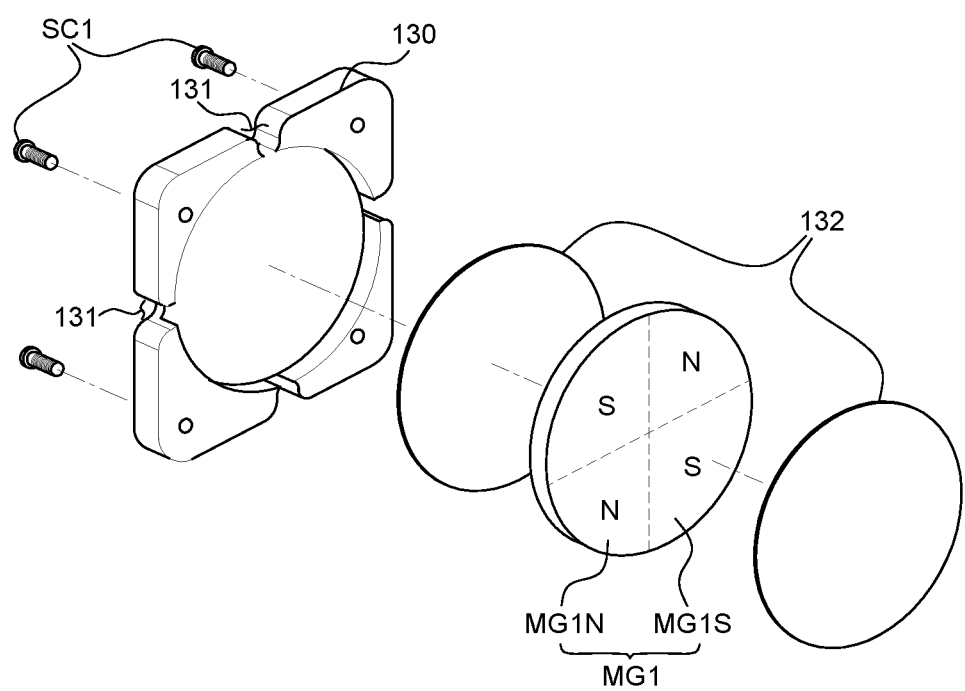
FIG. 3A is an exploded perspective view of a first magnet and a first cover of a tiled display according to an exemplary embodiment of the present disclosure.

FIG. 2 is a perspective view of a display device of a tiled display according to an exemplary embodiment of the present disclosure. FIG. 3A is an exploded perspective view of a first magnet and a first cover of a tiled display according to an exemplary embodiment of the present disclosure. FIG. 3B is a cross-sectional view of the tiled display taken along line IIIb-IIIb' of FIG. 2. FIG. 2 is a perspective view of the display device 110 when viewed from the behind and side thereof. Referring to FIGS. 2 to 3B, the tiled display 100 according to the exemplary embodiment of the present disclosure includes a display device 110, a first magnet MG1, and a first cover 130.

Referring to FIG. 2, each of the plurality of display devices 110 is an element to display an image and is a basic unit forming the tiled display 100. Each of the plurality of display devices 110 includes a display panel 111 and a back cover 112.

The display panel 111 is an element for displaying an image, e.g., to a user. In the display panel 111, a display element, circuitry for driving the display element, wiring and parts may be disposed, for example. The display element may be defined in different way depending on a type of the display panel 111. For example, when the display panel 111 is an organic light-emitting display panel, the display element may be an organic light-emitting element that includes an anode, an organic emissive layer, and a cathode. For example, when the display panel 111 is an inorganic light-emitting display panel, the display element may be a light-emitting diode (LED) or a micro LED including an n-type semiconductor layer, a p-type semiconductor layer, and an emissive layer. It is, however, to be understood that the present disclosure is not limited thereto. The display element of the display panel 111 may be implemented in a variety of ways.

The back cover 112 supports the back side of the display panel 111. The back cover 112 can protect the display panel 111 from the outside. The back cover 112 may be made of a material having rigidity and may be made of, for example, a metal material such as steel use stainless (SUS) and invar, or a plastic.

A plurality of first magnets MG1 and a plurality of first covers 130 are disposed on the back face of the display device 110. That is to say, the plurality of first magnets MG1 may be in contact with the rear face of the back cover 112. The first covers 130 are disposed to cover the first magnets MG1. The first magnets MG1 can fix the display devices 110 to the wall portion 120, which will be described later in detail with reference to FIGS. 7A to 7D.

Referring to FIG. 3A, the first magnet MG1 is disposed between the first cover 130 and the back cover 112. The first magnet MG1 is configured to rotate between the first cover 130 and the back cover 112. The first magnet MG1 may include a plurality of N-poles MG1N and a plurality of S-poles MGS1. For example, the first magnet MG1 may be, but is not limited to, a circular, quadrupole magnet formed by magnetizing neodymium, which includes two N-poles MG1N and two S-poles MG1S.

Referring to FIGS. 3A and 3B, the first cover 130 is disposed on the rear face of the first magnet MG1 and the back cover 112 to cover the first magnet MG1. The first cover 130 may have a shape surrounding the first magnet MG1 to thereby restrict movement of the first magnet MG1 so that the first magnet MG1 does not move out of the first cover 130. Accordingly, the first magnet MG1 can be rotated between the first cover 130 and the back cover 112.

Guide grooves 131 are formed in the first cover 130. The guide grooves 131 are formed in the edges of the first cover 130. For example, the guide grooves 131 may be formed in the edges of the first cover 130 such that they do not overlap with the first magnet MG1. In other embodiments, the guide grooves 131 may be formed in the edges of the first cover 130 so that they overlap with the first magnet MG1 as little as possible. For example, the guide grooves 131 may be formed on the upper edge, the lower edge, the left edge and the right edge of the first cover 130. Although the four guide grooves 131 are formed in the first cover 130 in FIG. 3A, it is to be understood that the number of the guide grooves 131 is not limited to four. In addition, although the guide grooves 131 partially overlap with the first magnet MG1 in FIGS. 3A and 3B, the present disclosure is not limited thereto. In some embodiments, the guide grooves 131 may not overlap with the first magnet MG1.

As will be described later, fasteners 145 of a second cover 140 may be inserted into the guide grooves 131 to align the first cover 130 with the second cover 140. A more detailed description thereon will be given with reference to FIGS. 7A to 7D.

First pads 132 are disposed between the first cover 130 and the first magnet MG1 and between the first magnet MG1 and the back cover 112. The first pads 132 may be made of a material having a low coefficient of friction so that the first magnet MG1 disposed between the first cover 130 and the back cover 112 can be easily rotated by the tiling tool 100T. For example, the first pads 132 may be made of, but is not limited to, a material having a low coefficient of friction such as Teflon.

Although the first pads 132 are disposed on both faces of the first magnet MG1 in FIG. 3A, the present disclosure is not limited thereto. For example, one or both faces of the first magnet MG1 may be coated with a material having a low coefficient of friction. In addition, although the first pads 132 are disposed on both faces of the first magnet MG1 in FIG. 3A, the present disclosure is not limited thereto. For example, the first pads 132 may be further extended along side faces (e.g., the circumference) of the first magnet MG1.

First screws SC1 for fixing the first cover 130 to the back cover 112 are disposed. The first screws SC1 are fastening members for fixing the first cover 130 to the back cover 112. The first cover 130 may be fixed to the back cover 112 by the first screws SC1. The first magnet MG1 may also be restricted by the first cover 130 and the first screws SC1 so that the first magnet MG1 may move only between the first cover 130 and the back cover 112.

Hereinafter, the second cover 140 and a second magnet MG2 will be described with reference to FIGS. 4 to 5C.

Figure 4:
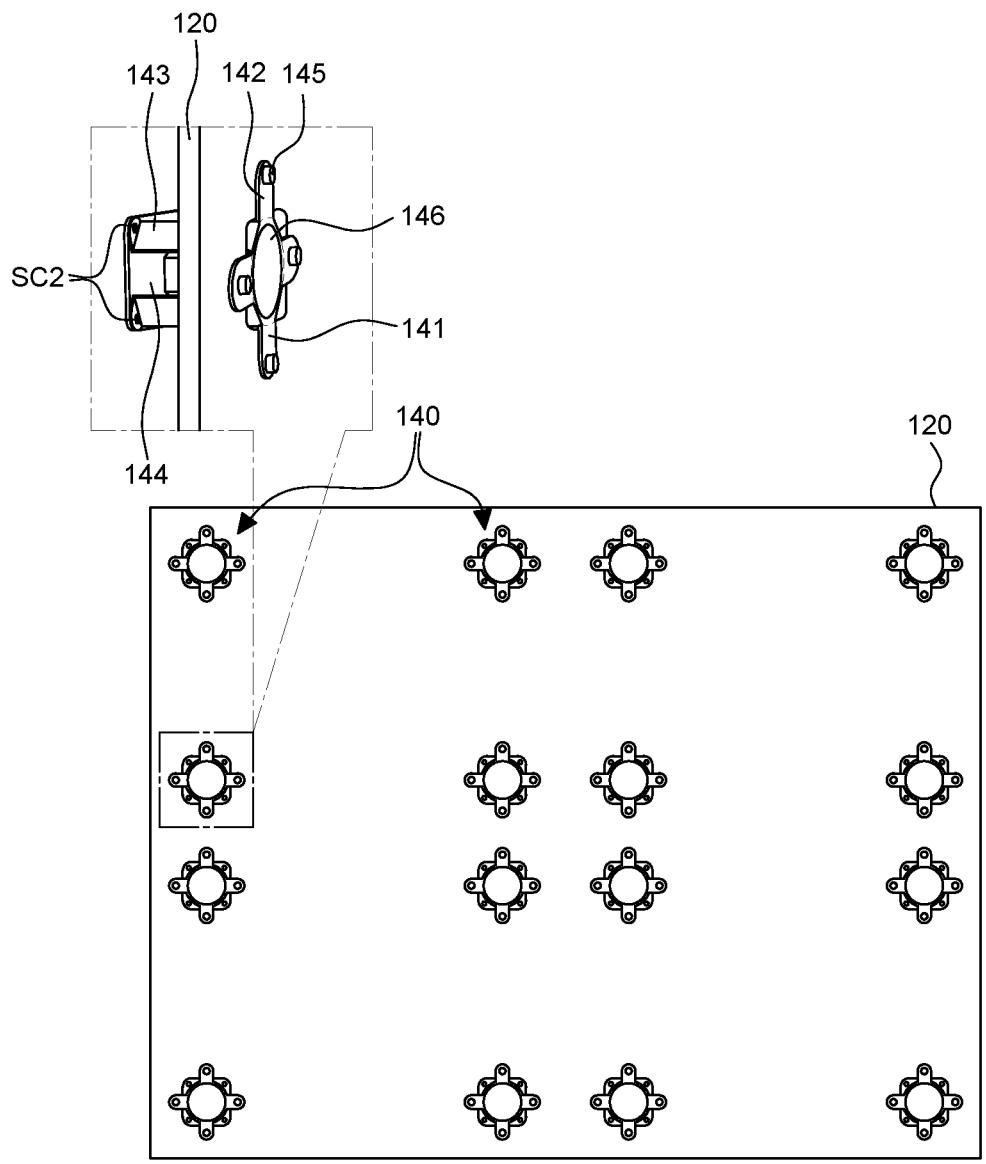
FIG. 4 is a front view of a wall portion of a tiled display according to an exemplary embodiment of the present disclosure.
Figure 5A:
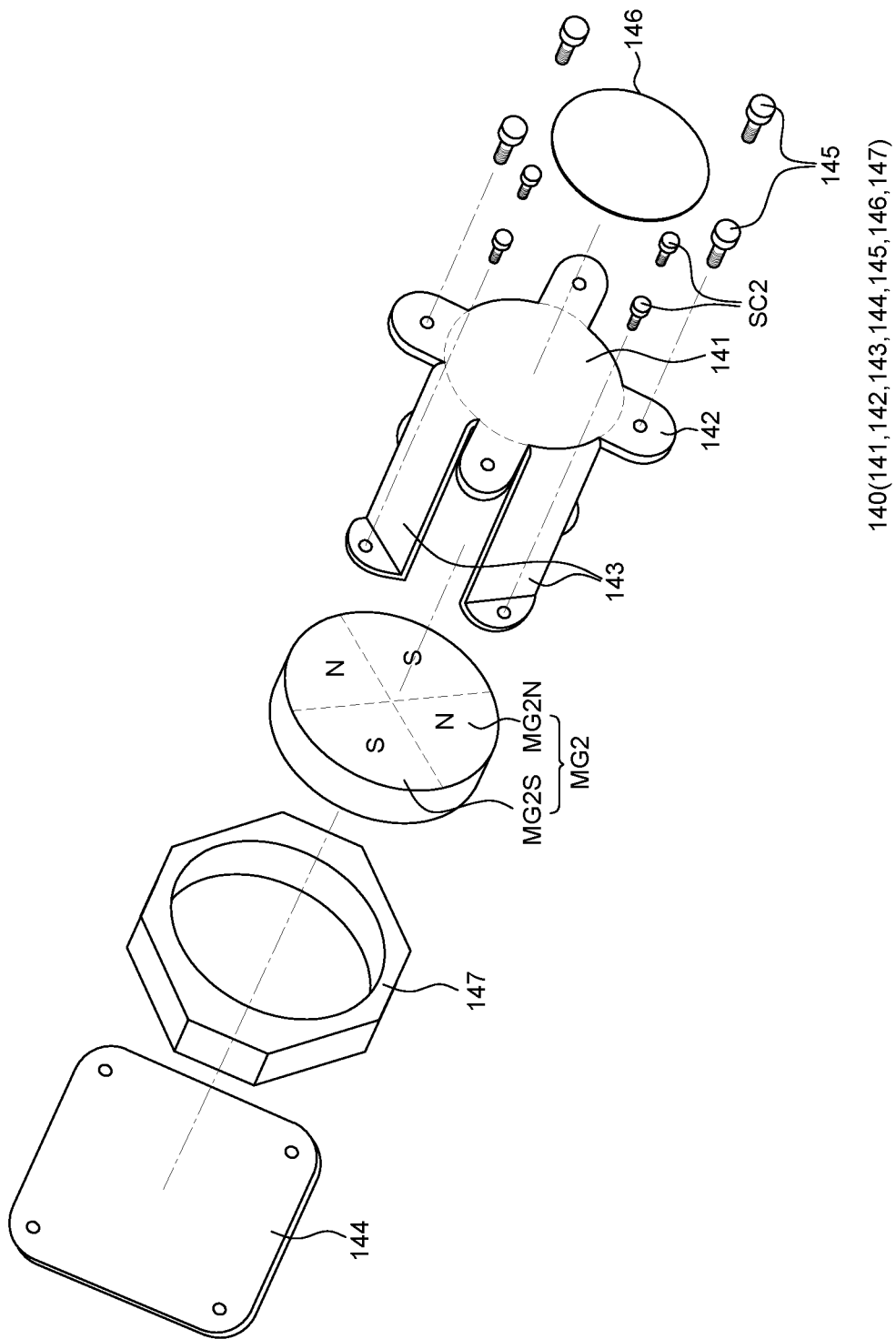
FIG. 5A is an exploded perspective view of a second magnet and a second cover of a tiled display according to an exemplary embodiment of the present disclosure.
Figure 5B:
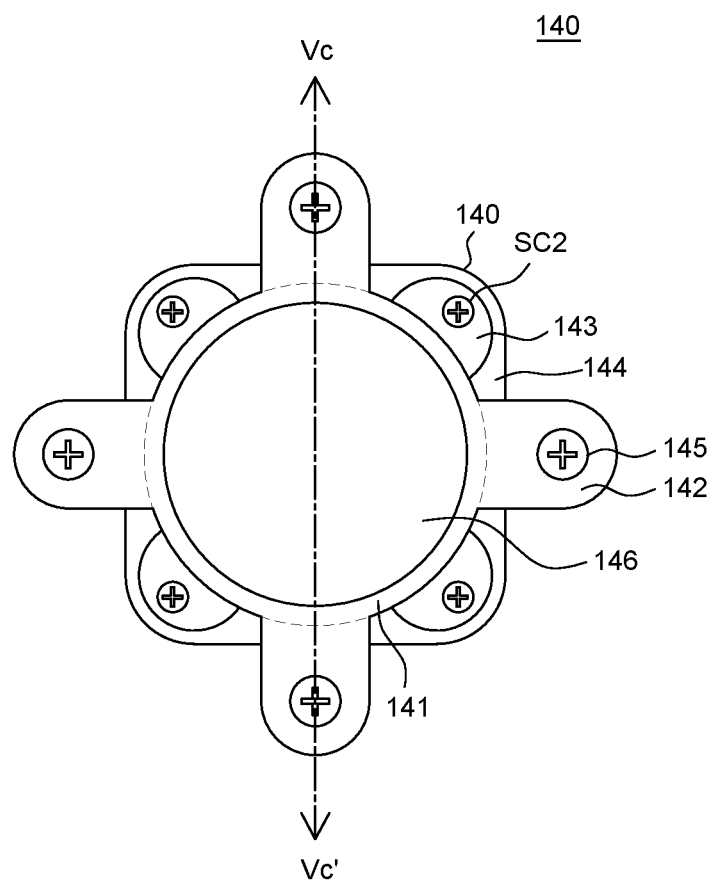
FIG. 5B is a front view of the second magnet and the second cover of the tiled display according to the exemplary embodiment of the present disclosure shown in FIG. 5A.

FIG. 4 is a front view of a wall portion of a tiled display according to an exemplary embodiment of the present disclosure. FIG. 5A is an exploded perspective view of a second magnet and a second cover of a tiled display according to an exemplary embodiment of the present disclosure. FIG. 5B is a front view of the second magnet and the second cover of the tiled display according to the exemplary embodiment of the present disclosure shown in FIG. 5A. FIG. 5C is a cross-sectional view of the second magnet and the second cover, taken along line Vc-Vc' of FIG. 5B. Referring to FIGS. 4 to 5C, the tiled display 100 according to the exemplary embodiment of the present disclosure includes second magnets MG2 and second covers 140 disposed on the wall portion 120.

Referring to FIGS. 4 and 5A, a plurality of second covers 140 connected to the wall portion 120 is disposed. The second covers 140 may be disposed in line with the first covers 130 of the plurality of display devices 110. For example, one or more of the second covers 140 are each disposed in line with a different one of the first covers 130 when the plurality of display devices 110 is coupled to the wall portion 120. A part of each of the plurality of second covers 140 is disposed on a surface of the wall portion 120 while the other part thereof is disposed on the opposite surface of the wall portion 120. In other words, each of the plurality of second covers 140 may penetrate through the wall portion 120.

Each of the second covers 140 includes a first fixing portion 141, a protruding portion 142, a guide portion 143, a second fixing portion 144, fasteners 145, a second pad 146, an anti-rotation cover 147, and second screws SC2.

The first fixing portion 141 is disposed in contact with the wall portion 120. The first fixing portion 141 may restrict the movement of the second magnet MG2 accommodated in the second cover 140 so that the second magnet MG2 does not move out of the second cover 140.

Figure 5C:
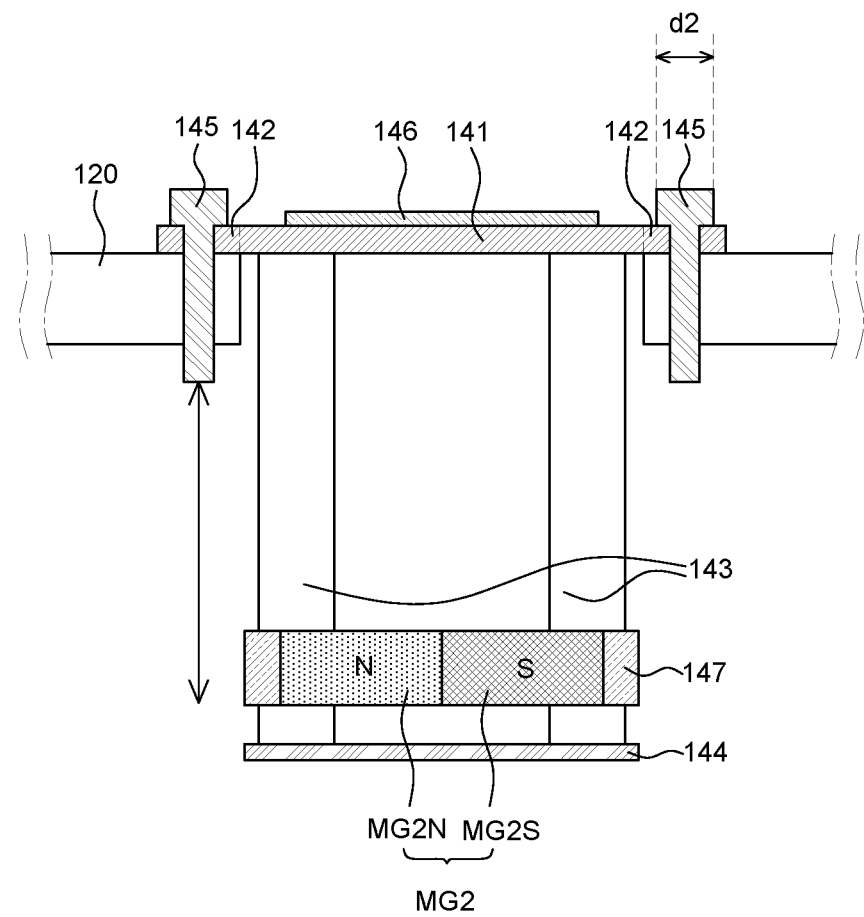
FIG. 5C is a cross-sectional view of the second magnet and the second cover, taken along line Vc-Vc' of FIG. 5B.

Referring to FIGS. 4, 5A, and 5C, the guide portion 143 is extended from the first fixing portion 141 in a direction perpendicular to or intersecting the surface of the wall portion 120. The guide portion 143 may be extended from the edge of the first fixing portion 141 in a direction perpendicular to or intersecting the rear face of the wall portion 120. The guide portion 143 may be extended from the first fixing portion 141 on the front face of the wall portion 120 to the rear face of the wall portion 120 through (e.g., a hole in) the wall portion 120.

Although the four guide portions 143 are shown in the drawings, the number of the guide portions 143 is not limited to four. Although the guide portion 143 is shown in FIGS. 4-5B as being extended from a part of the edge of the first fixing portion 141, where each of the four guide portions 143 are spaced apart from each other, the present disclosure is not limited thereto. The guide portion 143 may be extended from the entire edge of the first fixing portion 141.

Referring to FIGS. 4 and 5A, the second fixing portion 144 is disposed on the rear face of the wall portion 120. The second fixing portion 144 may restrict the movement of the second magnet MG2 accommodated in the second cover 140 so that the second magnet MG2 does not move out of the second cover 140. The second fixing portion 144 is disposed in parallel with or aligned to the first fixing portion 141. The second fixing portion 144 may be connected to the guide portions 143. Therefore, the first fixing portion 141 and the second fixing portion 144, which are in parallel or aligned to each other, may be integrally connected to the guide portions 143.

Referring to FIGS. 5A and 5B, the second screws SC2 for fixing the guide portions 143 to the second fixing portion 144 are disposed. The second screws SC2 are fastening members for fixing the guide portions 143 to the second fixing portion 144. The second fixing portion 144 may be fixed to the guide portion 143 by the second screws SC2. The second magnet MG2 disposed in the second cover 140 may move only in the space defined at least by the second fixing portion 144, the guide portions 143, and the first fixing portion 141.

Referring to FIGS. 5A and 5B, the protruding portion 142 is extended from the first fixing portion 141 to be in contact with the wall portion 120. The protruding portion 142 may be extended from the edge of the first fixing portion 141 in a direction along the front face of the wall portion 120. The protruding portion 142 may be extended from the edge of the first fixing portion 141 except for the portion from which the guide portion 143 is extended, such that it may be in contact with the front face of the wall portion 120.

The fasteners 145 for fixing the protruding portion 142 and the first fixing portion 141 to the wall portion 120 are disposed. The fasteners 145 are for fixing the protruding portions 142 and the first fixing portion 141 to the wall portion 120. The fasteners 145 may penetrate through the protruding portion 142 and the wall portion 120.

One end of each of the fasteners 145 protrudes out of the first fixing portion 141. That is to say, the fasteners 145 protrude from the first fixing portion 141 with respect to the front face of the wall portion 120. The fasteners 145 may be in line with the guide grooves 131 of the plurality of first covers 130 on the rear face of the plurality of display devices 110 when the display devices 110 are fixed to the wall portion 120. When the display devices 110 are fixed to the wall portion 120, the fasteners 145 are inserted into the guide grooves 131 so that the locations of the first cover 130 and the second cover 140 may be guided. The fasteners 145 inserted into the guide grooves 131 may be in contact with the rear face of the display device 110 or may be slightly spaced apart from the rear face of the display device 110.

Referring to FIGS. 2 and 5C, the diameter d2 of the fasteners 145 may be smaller than the diameter d1 of the guide grooves 131. In other words, the diameter d1 of the guide grooves 131 may be larger than the diameter d2 of the fasteners 145. If a display device 110 having a first cover 130 and a first magnet MG1 attached thereto deviates from adjacent display device 110 in the x-axis direction and/or the y-axis direction, it is possible to move (e.g., re-adjust) the display device 110 and the first cover 130 in the x-axis axis direction and/or the y-axis direction. The diameter d1 of the guide grooves 131 may be larger than the diameter d2 of the fasteners 145 so that the fasteners 145 inserted into the guide grooves 131 do not restrict the movement of the display device 110 and the first cover 130. In addition, there may be a margin that allows the display device 110 and the first cover 130 to move. Accordingly, the diameter d1 of the guide grooves 131 may be larger than the diameter d2 of the fasteners 145.

The second pad 146 is disposed in contact with the first fixing portion 141. The second pad 146 is disposed to overlap with the first fixing portion 141. Specifically, a surface of the first fixing portion 141 is in contact with the wall portion 120, and the second pad 146 is disposed on the opposite surface of the first fixing portion 141. The second pad 146 may be in contact with the first cover 130 when the display devices 110 are fixed to the wall portion 120. The second pad 146 may be made of a material having a small difference between a static friction coefficient and a dynamic friction coefficient. The difference between the static friction coefficient and the dynamic friction coefficient of the second pad 146 may be smaller than the difference between the static friction coefficient and the dynamic friction coefficient of the first fixing portion 141. For example, the second pad 146 may be made of silicon (Si).

The second pad 146 can be used to suppress the display devices 110 from slipping rapidly when an operator aligns the display devices 110 in contact with the wall portion 120. The second pad 146 may be disposed so that the display devices 110 slip gradually. In particular, the quality of images of the tiled display 100 can be improved by reducing the spacing between the plurality of display devices 110 so that the boundaries between the display devices 110 are not observed or not as apparent to a viewer. Therefore, it is desired to reduce the spacing between the display devices 110. If the display devices 110 slip rapidly on the wall portion 120, it is difficult to precisely adjust the spacing between the display devices 110. As the second pad 146 has a smaller difference between the static friction coefficient and the dynamic friction coefficient than the difference between the static friction coefficient and the dynamic friction coefficient of the first fixing portion 141, it allows the first cover 130 of the display devices 110 to gradually slip. Accordingly, it is possible to precisely align the display devices 110.

Referring to FIGS. 5A and 5C, the anti-rotation cover 147 is disposed between the first fixing portion 141 and the second fixing portion 144 while being in contact with one surface of the guide portion 143. The anti-rotation cover 147 is configured to be movable between the first fixing portion 141 and the second fixing portion 144. The anti-rotation cover 147 is formed in a polygonal shape (e.g., along the outer edges of the anti-rotation cover 147). At least a part of the side surfaces of the anti-rotation cover 147 is in contact with the guide portion 143. As the anti-rotation cover 147 has the side surfaces in contact with the guide portion 143 and has a polygonal shape, it may only move between the first fixing portion 141 and the second fixing portion 144 but is restricted from rotating.

The second magnet MG2 is disposed in the second cover 140. The second magnet MG2 is accommodated in the second cover 140. The second magnet MG2 is configured to be movable in the direction perpendicular to or intersecting the surface of the wall portion 120 along the inner circumferential surface of the second cover 140. The second magnet MG2 is fixed to the anti-rotation cover 147 and is movable between the first and second fixing portions 141 and 144 of the second cover 140 together with the anti-rotation cover 147.

The rotation of the second magnet MG2 is restricted by the anti-rotation cover 147 and may be movable between the first fixing portion 141 and the second fixing portion 144 together with the anti-rotation cover 147. The second magnet MG2 may include a plurality of N-poles MG2N and a plurality of S-poles MG2S, and the second magnet MG2 may have the same size and/or shape as the size and/or shape of the first magnet MG1, respectively. For example, the second magnet MG2 may be, but is not limited to, a circular, quadrupole magnet formed by magnetizing neodymium, which includes two N-poles MG2N and two S-poles MG2S.

Hereinafter, the tiling tool 100T for arranging the display devices 110 on the wall portion 120 and then fixing the plurality of display devices 110 to the wall portion 120 will be described with reference to FIGS. 6A to 6C.

Figure 6A:
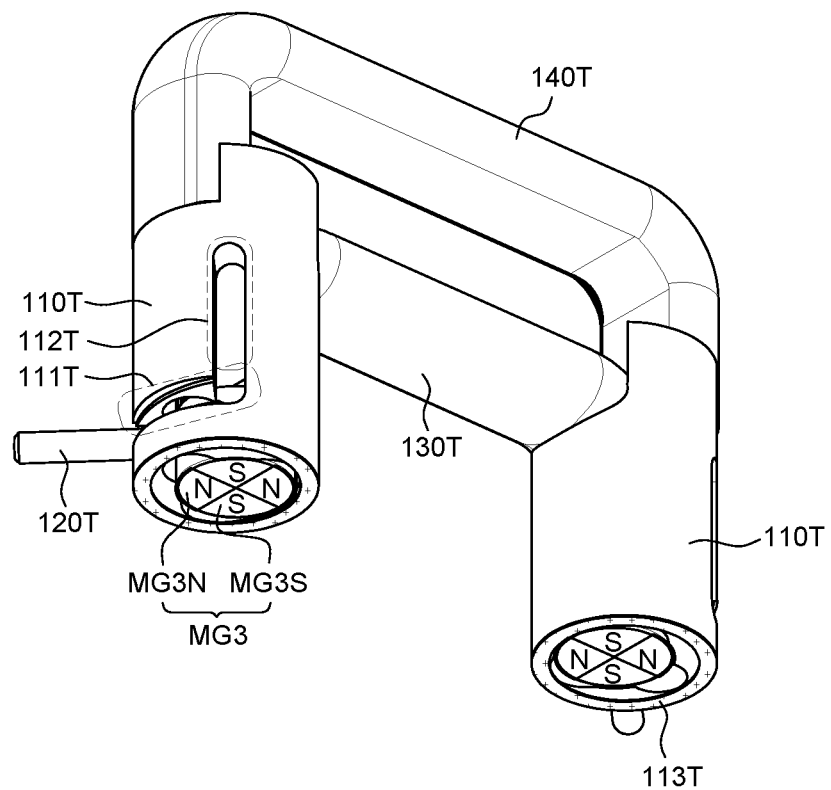
FIG. 6A is a perspective view of a tiling device according to an exemplary embodiment of the present disclosure.

FIG. 6A is a perspective view of a tiling tool according to an exemplary embodiment of the present disclosure. FIGS. 6B and 6C are cross-sectional views of the tiling tool according to the exemplary embodiment of the present disclosure. FIG. 6B is a cross-sectional view of the tiling tool 100T according to the exemplary embodiment of the present disclosure. FIG. 6C is a cross-sectional view of the tiling tool 100T when a rotation lever 120T and a release lever 130T of the tiling tool 100T of FIG. 6B are operated.

Referring to FIG. 6A, the tiling tool 100T according to the exemplary embodiment of the present disclosure includes a third cover 110T, a third magnet MG3, a rotation lever 120T, a release lever 130T, a handle 140T, and a third pad 113T.

The third magnet MG3 is disposed in the third cover 110T. The third magnet MG3 is accommodated in the third cover 110T. The third magnet MG3 is configured to be movable along the inner circumferential surface of the third cover 110T. The third magnet MG3 may be disposed in line with the first magnet MG1 when the display device 110 is aligned and fixed to the wall portion 120 and may rotate the first magnet MG1 to thereby fix or release the display device 110 to or from the wall portion 120. A more detailed description thereon will be given below with reference to FIGS. 7A to 7D.

The third magnet MG3 may include a plurality of N-poles MG3N and a plurality of S-poles MG3S, and the third magnet MG3 may have the same size and/or shape as the first magnet MG1 and second magnet MG2. For example, the third magnet MG3 may be, but is not limited to, a circular, quadrupole magnet formed by magnetizing neodymium, which includes two N-poles MG3N and two S-poles MG3S.

The third magnet MG3 is accommodated in the third cover 110T. The third magnet MG3 may be disposed on the inner circumferential surface of the third cover 110T, and the third magnet MG3 may move along the inner circumferential surface of the third cover 110T. The third cover 110T may have a hollow circular column shape conforming to the shape of the third magnet MG3, but may vary depending on the shape of the third magnet MG3.

The third pad 113T is disposed at one end of the third cover 110T. The third pad 113T can be used to prevent the tiling tool 100T from slipping when the tiling tool 100T is attached to the front face of the display device 110. If the tiling tool 100T deviates from the attachment position on the front face of the display device 110, the third magnet MG3 may not be in line with the first magnet MG1, such that it may be difficult to attach each of the display devices 110 to the wall portion 120. In view of the above, the third pad 113T prevents the tiling tool 100T from slipping on the front face of the display devices 110 so that the third magnet MG3 keeps in line with the first magnet MG1.

Figure 6B:
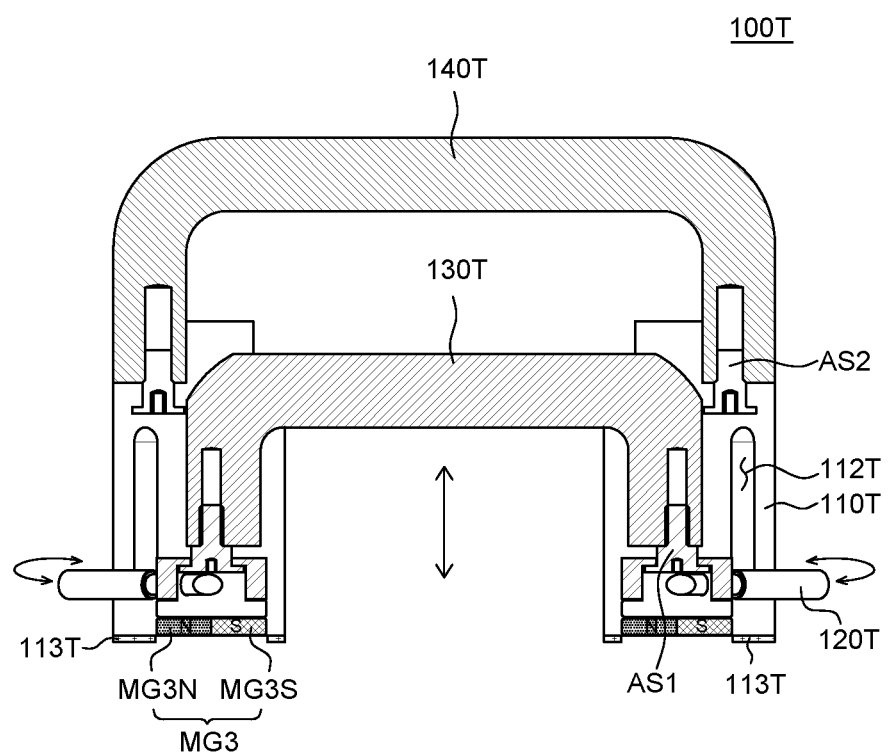
FIGS. 6B and 6C are cross-sectional views of the tiling device according to the exemplary embodiment of the present disclosure.

Referring to FIGS. 6A and 6B, the rotation lever 120T is connected to the third magnet MG3 accommodated in the third cover 110T to rotate the third magnet MG3. A part of the rotation lever 120T is inserted into the third cover 110T and connected to the third magnet MG3, and another part of the rotation lever 120T is disposed outside the third cover 110T so that an operator can rotate the rotation lever 120T. For example, a part of the rotation lever 120T may be fixed to a surface of the third magnet MG3, and another part of the rotation lever 120T may protrude out of the third cover 110T to serve as a knob that an operator grips. The rotation lever 120T may rotate along the circumferential direction of the third cover 110T, and the third magnet MG3 connected to the rotation lever 120T may also rotate together when the rotation lever 120T rotates.

A first guide groove 111T is formed in the third cover 110T so that the rotation lever 120T can rotate. The first guide groove 111T is disposed along the circumferential direction of the third cover 110T. The rotation lever 120T can rotate along the first guide groove 111T of the third cover 110T in the circumferential direction.

Referring to FIGS. 6A and 6B, the release lever 130T is connected to the third magnet MG3 accommodated in the third cover 110T to move the third magnet MG3. Specifically, the release lever 130T is inserted into the inner circumferential surface of the third cover 110T and connected to the third magnet MG3. The release lever 130T moves along the inner circumferential surface of the third cover 110T and can move the third magnet MG3. The release lever 130T moves in the longitudinal direction of the third cover 110T and can move the third magnet MG3. For example, the release lever 130T may be fixed to a part of the rotation lever 120T fixed to a surface of the third magnet MG3 to move the third magnet MG3.

As the release lever 130T moves along the inner circumferential surface of the third cover 110T, the rotation lever 120T fixed to the release lever 130T may also move together along the longitudinal direction of the third cover 110T. To this end, a second guide groove 112T is formed in the third cover 110T so that the rotation lever 120T moves along the longitudinal direction of the third cover 110T. The second guide groove 112T is formed along the longitudinal direction of the third cover 110T, and the rotation lever 120T may be moved along the second guide groove 112T as the release lever 130T is operated.

A first fastening member AS1 for fixing the release lever 130T to a part of the rotation lever 120T fixed to the surface of the third magnet MG3 is disposed. One end of the first fastening member AS1 may be fixed to a part of the rotation lever 120T and the other end thereof may be inserted into and fixed to the release lever 130T.

The handle 140T is disposed at the other end of the third cover 110T. The handle 140T may be fixed to the other end of the third cover 110T to allow an operator to grip the handle 140T to control the tiling tool 100T.

A second fastening member AS2 for fastening the handle 140T to the other end of the third cover 110T is disposed. One end of the second fastening member AS2 may be fixed to the other end of the third cover 110T, and the other end thereof may be inserted into and fixed to the handle 140T.

Although a pair of third magnets MG3 are disposed in the tiling tool 100T shown in FIGS. 6A and 6B, the number of the third magnets MG3 is not limited thereto. The numbers of the third cover 110T, the rotation lever 120T, and the like may vary depending on the number of the third magnets MG3.

Figure 6C:
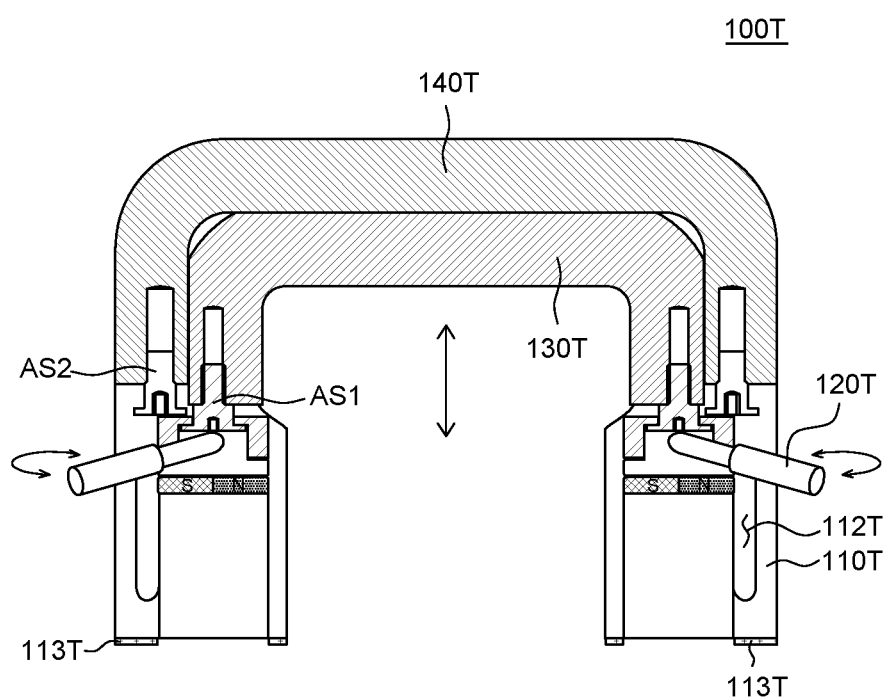

Referring to FIGS. 6B and 6C, the polarity of the third magnet MG3 can be inverted in place by rotating the rotation lever 120T. For example, referring to FIG. 6B, by rotating the rotation lever 120T to a specific position, the N-pole MG3N of the third magnet MG3 may be disposed on one side and the S-pole MG3S of the third magnet MG3 may be disposed on the other side. For example, referring to FIG. 6C, by rotating the rotation lever 120T to another position, the N-pole MG3N of the third magnet MG3 may be disposed on the other side and the S-pole MG3S of the third magnet MG3 may be disposed on the one side. In this manner, by rotating the rotation lever 120T to rotate the third magnet MG3, the polarity of the third magnet MG3 can be inverted at that position.

Referring to FIGS. 6B and 6C, the third magnet MG3 can be moved from one end to the other end of the third cover 110T by moving the release lever 130T. For example, referring to FIG. 6B, the third magnet MG3 may be exposed through the end of the third cover 110T, i.e., the outside by moving the release lever 130T away from the handle 140T. In addition, referring to FIG. 6C, the third magnet MG3 may be moved toward the other end of the third cover 110T, i.e., toward the inner side of the third cover 110T so that it is not exposed to the outside by moving the release lever 130T closer to the handle 140T.

Hereinafter, a method of assembling the tiled display 100 by fixing the plurality of display devices 110 to the wall portion 120 using the tiling tool 100T will be described in detail with reference to FIGS. 7A to 7D.

Figure 7A:
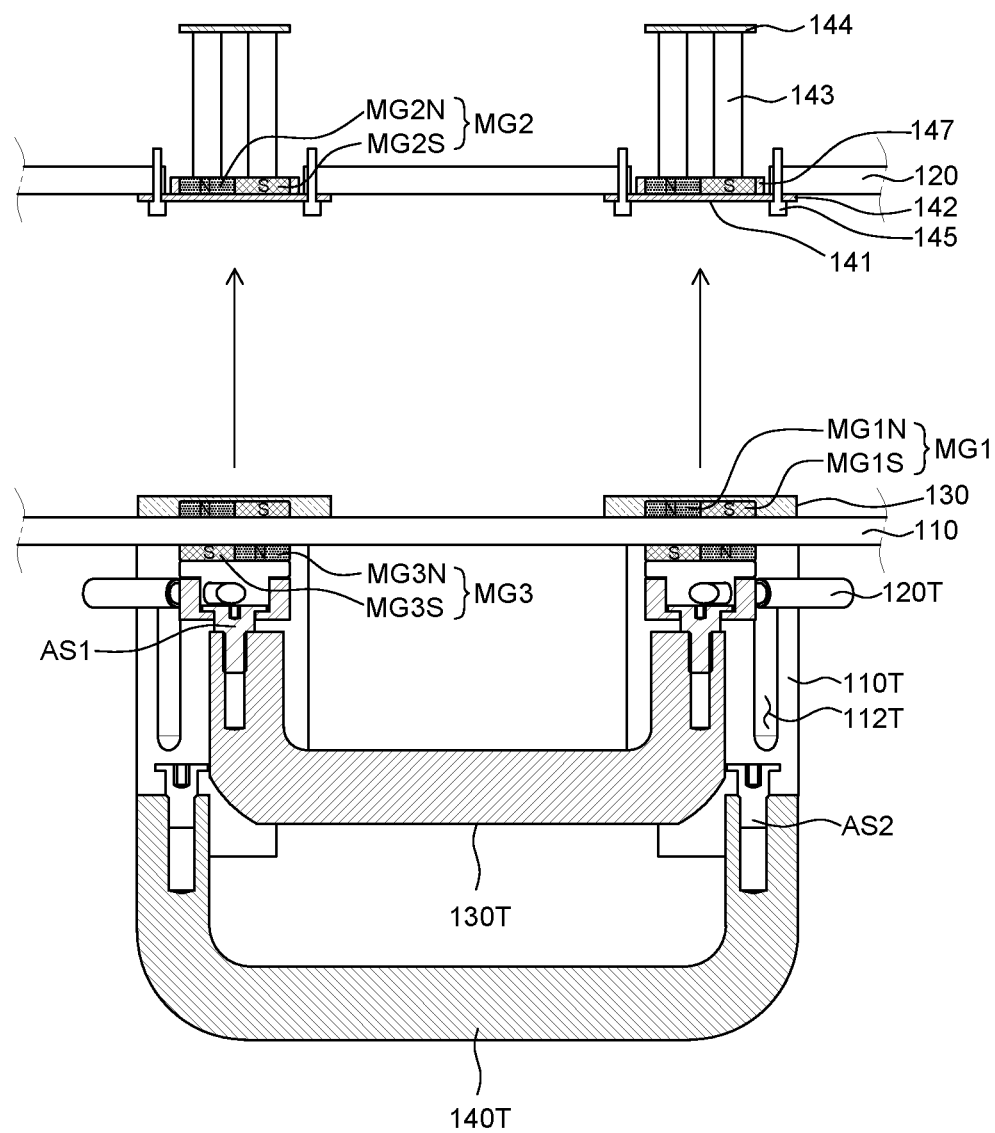
FIGS. 7A, 7B, 7C, and 7D are cross-sectional views for illustrating a method for assembling a tiling display device according to an exemplary embodiment of the present disclosure.
Figure 7B:
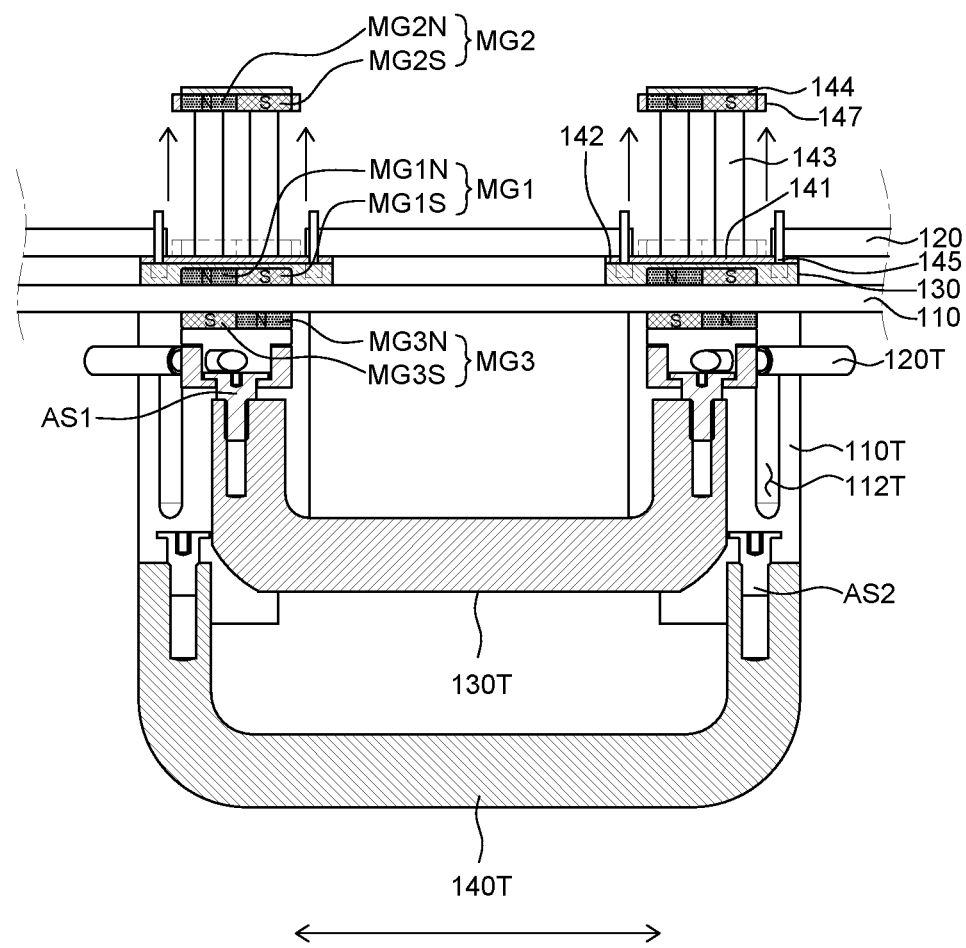
Figure 7C:
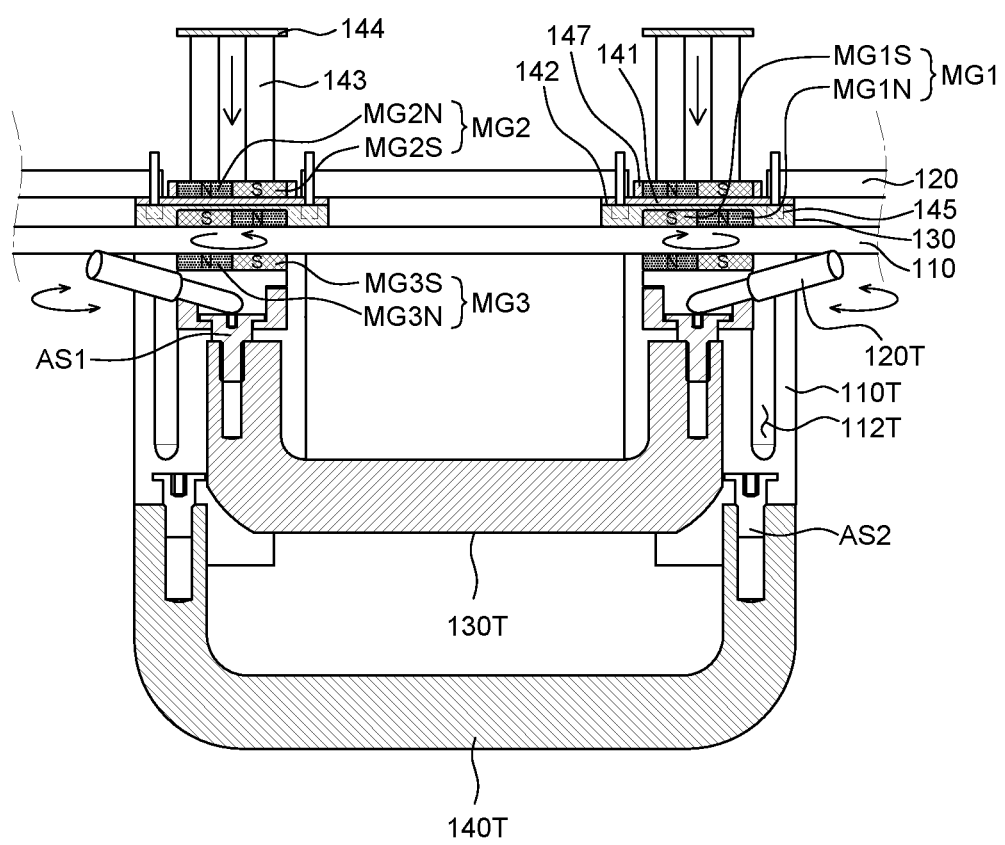
Figure 7D:
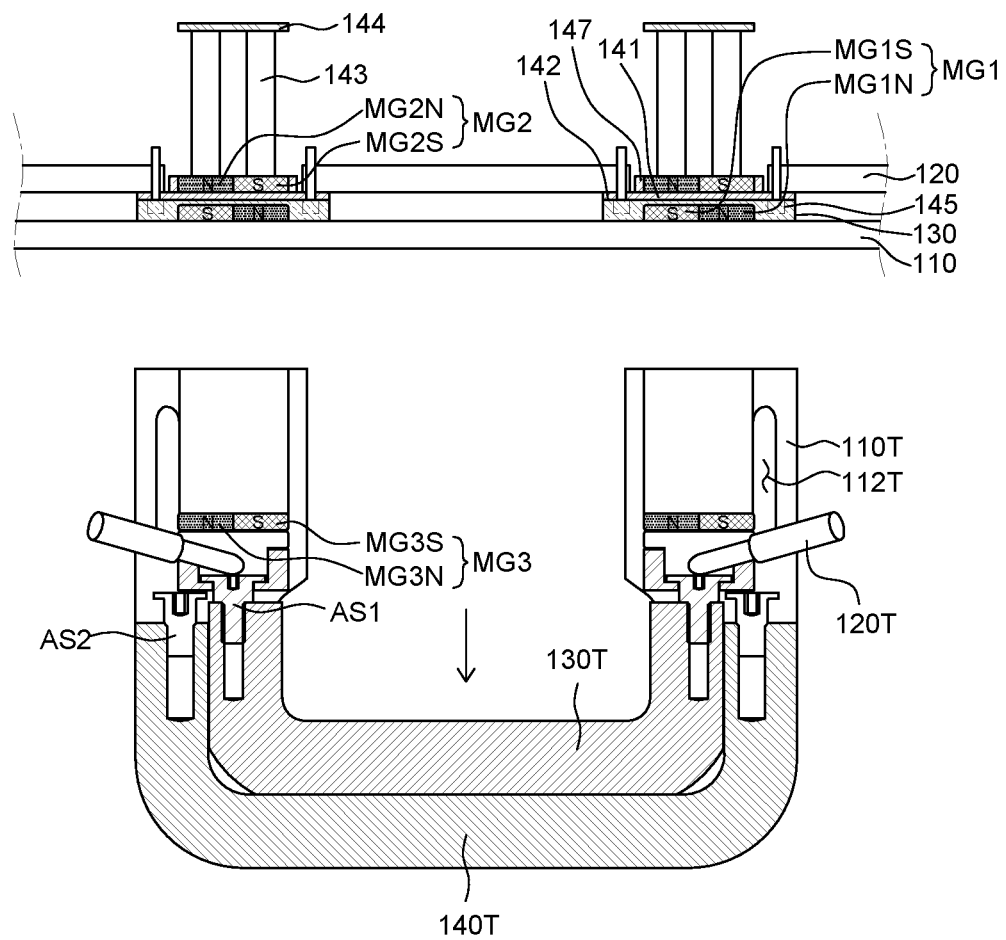

FIGS. 7A, 7B, 7C, and 7D are cross-sectional views for illustrating a method for assembling a tiled display according to an exemplary embodiment of the present disclosure. FIG. 7A is a cross-sectional view for illustrating the operation of moving the plurality of display devices 110 toward the wall portion 120 using the tiling tool 100T. FIG. 7B is a cross-sectional view for illustrating an operation for aligning the locations of the plurality of display devices 110 using the tiling tool 100T. FIG. 7C is a cross-sectional view for illustrating an operation for fixing the plurality of display devices 110 to the wall portion 120 using the tiling tool 100T. FIG. 7D is a view for illustrating an operation for releasing the tiling tool 100T from the plurality of display devices 110.

Referring to FIG. 7A, the tiling tool 100T is attached to the front face of the display device 110. The third magnet MG3 of the tiling tool 100T may be placed in line with the first magnet MG1 on the rear face of the display device 110, so that the tiling tool 100T may be attached to the front face of the display device 110.

The third magnet MG3 of the tiling tool 100T is disposed to overlap with the first magnet MG1 on the rear face of the display device 110 such that one of the poles of the third magnet MG3 overlaps with the opposite pole of the first magnet MG1. For example, while the tiling tool 100T is attached to the front face of the display device 110, the N-pole MG3N of the third magnet MG3 overlaps with the S-pole MG1S of the first magnet MG1 so that attractive force can be formed between the third magnet MG3 and the first magnet MG1. Therefore, the attractive force is formed between the third magnet MG3 of the tiling tool 100T and the first magnet MG1 on the rear face of the display device 110 so that the tiling tool 100T can be fixed to the display device 110. Then, an operator may grip the handle 140T of the tiling tool 100T while the tiling tool 100T is fixed to the display device 110 to move the tiling tool 100T and the display device 110 toward the wall portion 120.

Referring to FIG. 7B, the display device 110 is moved toward the wall portion 120. The first magnet MG1 on the rear face of the display device 110 may be positioned in line with the second magnet MG2 of the wall portion 120 to allow the display device 110 to be in contact with the wall portion 120. The first magnet MG1 and the first cover 130 on the rear face of the display device 110 may be positioned in line with the second magnet MG2 and the second cover 140 of the wall portion 120 to allow the display device 110 to be in contact with the wall portion 120.

Specifically, the display devices 110 may be brought into contact with the wall portion 120 such that the first cover 130 and the first fixing portion 141 of the second cover 140 may overlap with each other. When the first cover 130 is disposed in line with the second cover 140, the fasteners 145 of the second cover 140 may be inserted into the guide grooves 131 of the first cover 130. That is to say, when the display device 110 is brought into contact with the wall portion 120, the location of the display device 110 may be aligned preliminarily by the guide grooves 131 of the first cover 130 and the fasteners 145 of the second cover 140.

When the display device 110 is brought into contact with the wall portion 120, the first magnet MG1 on the rear face of the display device 110 overlaps with the second magnet MG2 of the wall portion 120 such that their same poles overlap with each other. For example, the display device 110 may be brought into contact with the wall portion 120 with the N-pole MG1N of the first magnet MG1 overlapping with the N-pole MG2N of the second magnet MG2, such that a repulsive force may be formed between the first magnet MG1 and the second magnet MG2. The second magnet MG2 may move away from the first magnet MG1 by the repulsive force. For example, the second magnet MG2 moves from the first fixing portion 141 adjacent to the first cover 130 and the first magnet MG1 toward the second fixing portion 144 along the guide portion 143. Accordingly, the second magnet MG2 is in contact with the second fixing portion 144, and the display device 110 is in contact with the wall portion 120 by an operator gripping the tiling tool 100T but may not be fixed to the wall portion 120.

Because no attractive force is formed between the second magnet MG2 and the first magnet MG1 when the display device 110 is brought into contact with the wall portion 120, it is possible to prevent that the display device 110 is rapidly brought into contact with the wall portion 120 by the repulsive force between the second magnet MG2 and the first magnet MG1. If an attractive force is formed between the first magnet MG1 and the second magnet MG2 when the display device 110 is brought into contact with the wall portion 120, the attractive force acts when the display device 110 approaches the wall portion 120 such that the display device 110 may be suddenly attached to the wall portion 120. As a result, the display device 110 may be subjected to a large impact. In order to prevent the display device 110 from being suddenly attached to the wall portion 120 by the attractive force between the first magnet MG1 and the second magnet MG2, a repulsive force may be formed between the first magnet MG1 and the second magnet MG2 when the display device 110 is brought into contact with the wall portion 120.

Subsequently, the operator may move the tiling tool 100T to adjust the alignment of the display device 110 which has been preliminarily aligned by the fasteners 145 of the second cover 140 and the guide grooves 131 of the first cover 130. In doing so, since the first cover 130 on the rear face of the display device 110 is disposed in contact with the second pad 146 of the second cover 140 of the wall portion 120, the display device 110 does not rapidly slip but can gradually slip. Thus, the operator can move the display device 110 slowly and little by little by the second pad 146 of the wall portion 120, so that the display device 110 can be precisely aligned.

Referring to FIG. 7C, the position of each of the plurality of display devices 110 on the wall portion 120 is precisely aligned, and then each of the plurality of display devices 110 is secured to the wall portion 120. The attractive force between the first magnet MG1 on the rear face of the display device 110 and the second magnet MG2 on the wall portion 120 can be generated by using the tiling tool 100T to thereby fix the display device 110 to the wall portion 120.

Initially, the third magnet MG3 of the tiling tool 100T and the first magnet MG1 on the rear face of the display device 110 are arranged such that their opposite poles overlap with each other so that the attractive force acts between the third magnet MG3 and the first magnet MG1. On the other hand, the first magnet MG1 on the rear face of the display device 110 and the second magnet MG2 on the wall portion 120 are arranged such that their same poles overlap with each other so that the repulsive force acts between the first magnet MG1 and the second magnet MG2. The second magnet MG2 is disposed on the side of the second fixed portion 144 by the repulsive force with the first magnet MG1.

By rotating the third magnet MG3 using the rotation lever 120T of the tiling tool 100T, the first magnet MG1 can also rotate together with the third magnet MG3 by the attractive force. For example, the rotation lever 120T may be rotated while the N-pole MG3N of the third magnet MG3 overlaps with the S-pole MG1S of the first magnet MG1 and with the S-pole MG2S of the second magnet MG2. As the third magnet MG3 and the first magnet MG1 rotate, the N-pole MG3N of the third magnet MG3 and the S pole MG1S of the first magnet MG1 may overlap with the N-pole MG2N of the second magnet MG2. The attractive force may act between the third magnet MG3 of the tiling tool 100T and the first magnet MG1 on the rear face of the display device 110, and the attractive force may act between the first magnet MG1 of the rear face of the display device 110 and the second magnet MG2 of the wall portion 120 as well.

The second magnet MG2 disposed on the side of the second fixing portion 144 may move closer to the first magnet MG1. The second magnet MG2 may move from the second fixing portion 144 toward the first fixing portion 141 by the attractive force, and the first magnet MG1 and the second magnet MG2 may be fixed with the first fixing portion 141 and the first cover 130 therebetween. In this manner, the display device 110 can be fixed to the wall portion 120 by rotating the third magnet MG3 of the tiling tool 100T.

Subsequently, referring to FIG. 7D, after the display device 110 is fixed to the wall portion 120, the tiling tool 100T is released. Specifically, the tiling tool 100T is detached from the display device 110 using the release lever 130T of the tiling tool 100T.

Specifically, after the display device 110 is fixed to the wall portion 120 by generating the attractive force between the first magnet MG1 on the rear face of the display device 110 and the second magnet MG2 on the wall portion 120, the tiling tool 100T may be detached from it. At this time, the attractive force also acts between the third magnet MG3 of the tiling tool 100T and the first magnet MG1 on the rear face of the display device 110. Even though the third magnet MG3 of the tiling tool 100T is rotated, the first magnet MG1 is rotatable and thus the first magnet MG1 can still rotate together with the third magnet MG3. Thus, the attractive force can act between the first and third magnets MG1 and MG3.

While the attractive force is acting between the first magnet MG1 and the third magnet MG3, the release lever 130T may be moved in order to detach the tiling tool 100T including the third magnet MG3 from the display device 110. By pulling the release lever 130T toward the handle 140T, the third magnet MG3 connected to the release lever 130T may also move away from the display device 110 along the inner circumferential surface of the third cover 110T. As a result, the spacing between the third magnet MG3 and the first magnet MG1 is increased and accordingly the attractive force therebetween is reduced. Thus, it is possible to easily detach the tiling tool 100T from the display device 110.

If it is necessary to realign the display device 110 or to replace and/or repair the display device 110 after the display device 110 is fixed to the wall portion 120, it is possible to release the display device 110 from the wall portion 120. The display device 110 can be easily released from the wall portion 120 by using the tiling tool 100T. Hereinafter, a method of releasing the plurality of display devices 110 from the wall portion 120 using the tiling tool 100T will be described in detail with reference to FIGS. 8A to 8C.

Figure 8A:
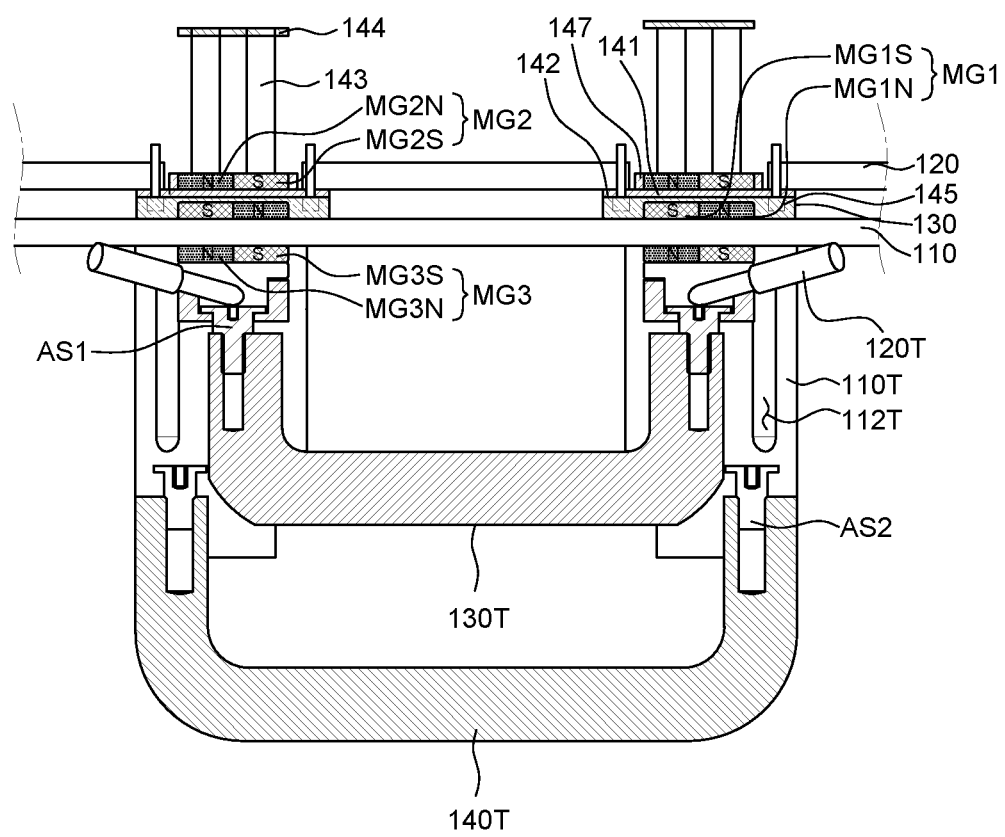
FIGS. 8A, 8B, and 8C are cross-sectional views for illustrating an operation for disassembling a tiled display according to an exemplary embodiment of the present disclosure.
Figure 8B:
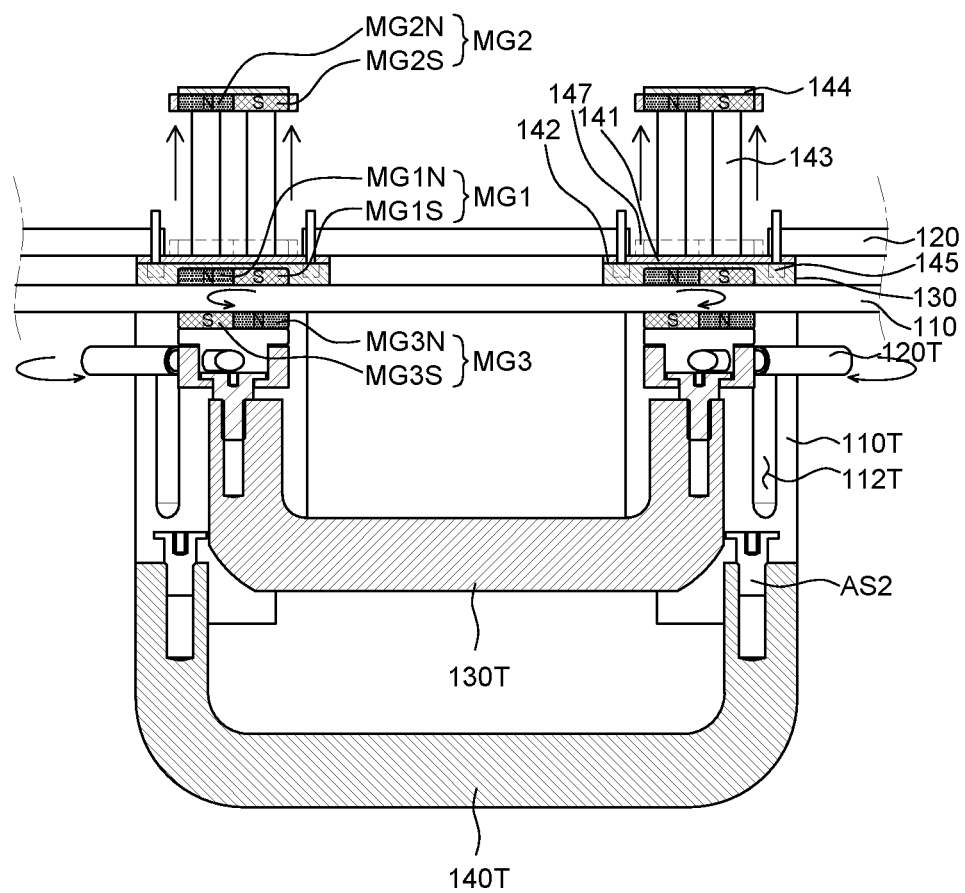
Figure 8C:
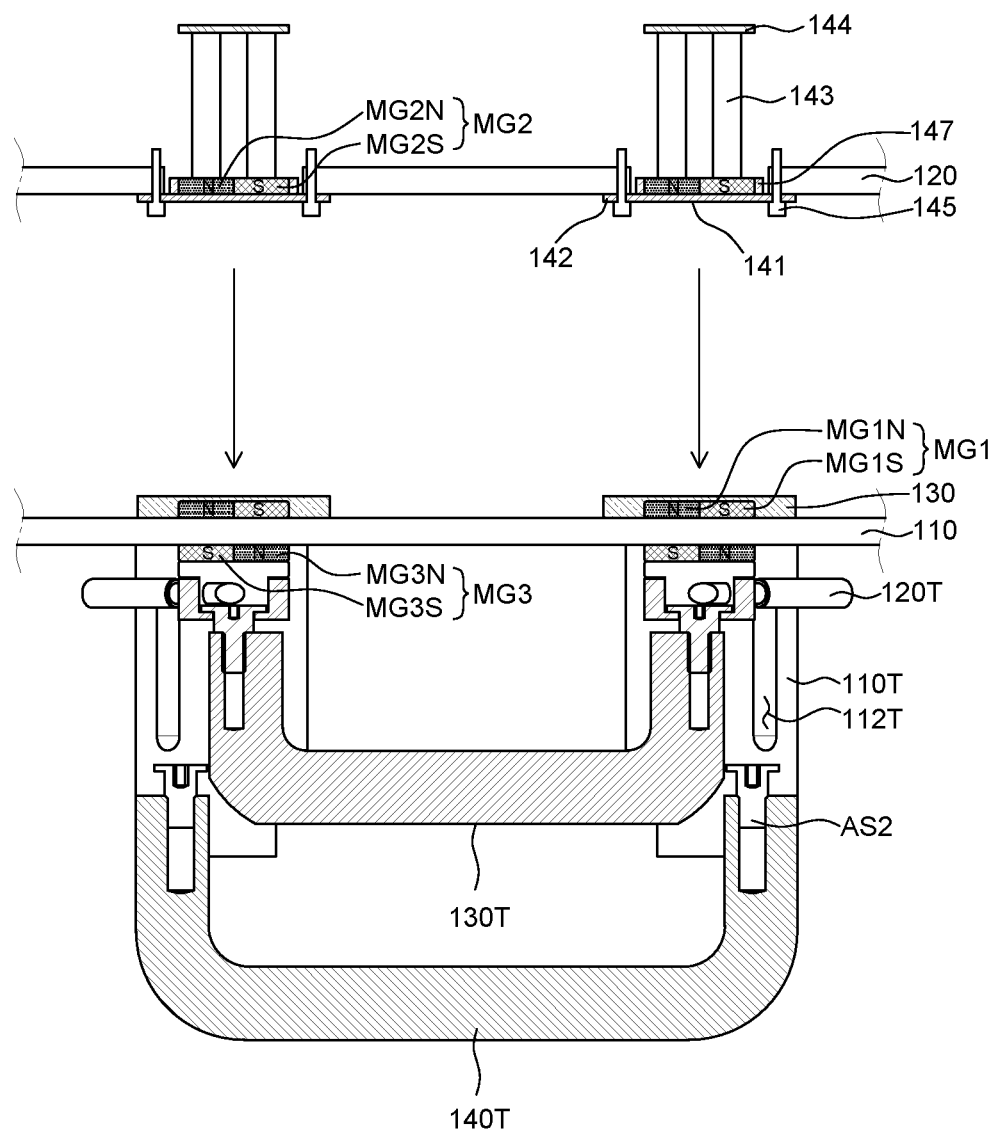

FIGS. 8A, 8B, and 8C are cross-sectional views for illustrating an operation for disassembling a tiled display according to an exemplary embodiment of the present disclosure. FIG. 8A is a view for illustrating an operation for fixing the tiling tool 100T to the plurality of display devices 110. FIG. 8B is a cross-sectional view for illustrating an operation for releasing a plurality of display devices 110 fixed to the wall portion 120 using the tiling tool 100T. FIG. 8C is a cross-sectional view for illustrating an operation for moving the plurality of display devices 110 from the wall portion 120 using the tiling tool 100T.

Referring to FIG. 8A, the tiling tool 100T is attached to the front face of the display device 110. The third magnet MG3 of the tiling tool 100T may be placed in line with the first magnet MG1 on the rear face of the display device 110, so that the tiling tool 100T may be attached to the front face of the display device 110.

The third magnet MG3 of the tiling tool 100T is disposed to overlap with the first magnet MG1 on the rear face of the display device 110 such that one of the poles of the third magnet MG3 overlaps with the opposite pole of the first magnet MG1. For example, when the tiling tool 100T is attached to the front face of the display device 110, the N-pole MG3N of the third magnet MG3 may overlap with the S-pole MG1S of the first magnet MG1. Therefore, the attractive force is formed between the third magnet MG3 of the tiling tool 100T and the first magnet MG1 on the rear face of the display device 110 so that the tiling tool 100T can be fixed to the front face of the display device 110.

Referring to FIG. 8B, the display device 110 is released from the wall portion 120 using the rotation lever 120T of the tiling tool 100T. Specifically, the repulsive force may be formed between the first magnet MG1 on the rear face of the display device 110 and the second magnet MG2 on the wall portion 120 by using the tiling tool 100T to thereby move the display device 110 fixed to the wall portion 120.

The attractive force acts between the third magnet MG3 of the tiling tool 100T and the first magnet MG1 on the rear face of the display device 110, and the attractive force acts between the first magnet MG1 of the rear face of the display device 110 and the second magnet MG2 of the wall portion 120. For example, the N-pole MG3N of the third magnet MG3, the S-pole MG1S of the first magnet MG1 and the N-pole MG2N of the second magnet MG2 may overlap with one another. Then, the tiling tool 100T is fixed to the front face of the display device 110, and the display device 110 is fixed to the wall portion 120.

Subsequently, by rotating the third magnet MG3 using the rotation lever 120T of the tiling tool 100T, the first magnet MG1 can also rotate together with the third magnet MG3 by the attractive force. For example, by rotating the rotation lever 120T while the N-pole MG3N of the third magnet MG3 overlaps with the S-pole MG1S of the first magnet MG1, the first magnet MG1 can also rotate by the rotation of the third magnet MG3.

However, the second magnet MG2 cannot rotate together with the first magnet MG1 but may be fixed even though the attractive force acts between the first magnet MG1 and the second magnet MG2. Specifically, the second magnet MG2 of the wall portion 120 is surrounded by the anti-rotation cover 147, and at least some of the side surfaces of the anti-rotation cover 147 in a polygonal shape is in contact with the guide portions 143. Accordingly, the second magnet MG2 cannot rotate.

When the first magnet MG1 is rotated, a repulsive force may act between the first magnet MG1 and the second magnet MG2 rather than attractive force. For example, when the first magnet MG1 rotates by the rotation of the third magnet MG3 with the N-pole MG1N of the first magnet MG1 overlapping with the S-pole MG2S of the second magnet MG2, the N-pole MG1N of the first magnet MG1 can be disposed to overlap with the N-pole MG2N of the second magnet MG2. Consequently, a repulsive force may act between the first magnet MG1 and the second magnet MG2, instead of the attractive force.

Then, the second magnet MG2 may move away from the first magnet MG1 by the repulsive force. The second magnet MG2 can move from the first fixing portion 141 to the second fixing portion 144 by the repulsive force. As the second magnet MG2 moves toward the second fixing portion 144, the first cover 130 and the first fixing portion 141 fixed to the first magnet MG1 and the second magnet MG2 may not be fixed. In this manner, the display device 110 can be released from the wall portion 120 while the tiling tool 100T is fixed to the display device 110.

Subsequently, referring to FIG. 8C, the display device 110 can be removed from the wall portion 120 and moved. Since the repulsive force acts between the first magnet MG1 on the rear face of the display device 110 and the second magnet MG2 of the wall portion 120, the display device 110 is no longer fixed to the wall portion 120 and can be separated from the wall portion 120. On the other hand, the attractive force keeps acting between the third magnet MG3 of the tiling tool 100T and the first magnet MG1 on the rear face of the display device 110 and thus the tiling tool 100T can be fixed to the display device 110. Then, an operator may grip the handle 140T of the tiling tool 100T while the tiling tool 100T is fixed to the display device 110 to move the tiling tool 100T and the display device 110 away from or to the outside of the wall portion 120.

In a conventional process, a plurality of display devices is fastened to the wall portion from the behind of the display devices. Therefore, a work space is required behind the wall portion for the operator who fastens the plurality of display devices to the wall portion. Further, since the operator works behind the wall portion, it is difficult for the operator to check deviations in the spacing and/or alignment between the display devices. Further, if it is found that there is a misalignment in the display devices after the display devices were fastened to the wall portion, the display devices have to be released again for re-alignment. As a result, additional work time and additional costs were incurred.

In contrast, according to the tiled display 100 according to the exemplary embodiment of the present disclosure, the display devices 110 can be fixed to and released from the wall portion 120 in front of the display devices 110. A first magnet MG1 configured to be rotatable is disposed on the rear face of each of the plurality of display devices 110. A second magnet MG2 is disposed on the wall portion 120, which is in line with the first magnet MG1 and is movable only in a direction perpendicular to or intersecting a plane of a surface of the first magnet MG1. The attractive force may be formed between the first magnet MG1 on the rear face of each of the display devices 110 and a corresponding second magnet MG2 on the wall portion 120, such that each of the display devices 110 can be fixed to the wall portion 120. For example, by rotating the first magnet MG1 on the rear face of each of the display devices 110 so that its poles overlap with the opposite poles of the second magnet MG2 on the wall portion 120, the display devices 110 can be fixed to the wall portion 120. To rotate the first magnet MG1 on the rear face of each of the display devices 110, the tiling tool 100T including the third magnet MG3 is placed on the front face of each of the display devices 110 to rotate the third magnet MG3 to rotate the first magnet MG1. That is to say, after placing the third magnet MG3 on the front face of each of the display devices 110, the third magnet MG3 may be rotated to thereby fix or release the display devices 110 to or from the wall portion 120. Therefore, it is possible to check in real-time if there is a deviation in the spacing and/or alignment between the display devices 110 from the front of the display devices 110, and to fix the display devices 110 to the wall portion 120 after adjusting the locations of the display devices 110. In this manner, the operator can fasten the display devices 110 to the wall portion 120 from in front of the display devices 110 and thus can align them precisely.

In addition, according to the exemplary embodiment of the present disclosure, since the operator can work in front of the tiled display 100, no work space behind the wall portion 120 is required. Specifically, the operator can fix the display devices 110 to the wall portion 120 by rotating the third magnet MG3 of the tiling tool 100T from in front of the display devices 110. Therefore, no additional work space behind the wall portion 120 for an operator to fasten the display devices 110 to the wall portion 120 is required.

In addition, according to the exemplary embodiment of the present disclosure, it is possible to fix the display devices 110 to the wall portion 120 by rotating the rotation lever 120T of the tiling tool 100T, and thus reducing the time taken for assembling the tiled display 100. Initially, to fix the display devices 110 to the wall portion 120, the tiling tool 100T may be attached to the front face of the display devices 110. Then, the display devices 110 are aligned on the wall portion 120 using the tiling tool 100T. Subsequently, the rotation lever 120T of the tiling tool 100T is rotated, so that the third magnet MG3 and the first magnet MG1 attracted by the third magnet MG3 can be rotated together. By doing so, the attractive force may be formed between the first magnet MG1 on the rear face of each of the display devices 110 and the second magnet MG2 on the wall portion 120, such that the display devices 110 can be fixed to the wall portion 120. In this manner, the display devices 110 can be fixed to the wall portion 120 by rotating the third magnet MG3 of the tiling tool 100T, and thus reducing the time taken for fastening. As a result, according to the exemplary embodiment of the present disclosure, the operator can fix the display devices 110 to the wall portion 120 more quickly than using a conventional process.

According to the exemplary embodiment of the present disclosure, the tiling tool 100T allows for easy maintenance of the display devices 110. In a conventional process or assembly, if one of display devices fixed to a wall portion is to be repaired or replaced, all of the display devices have to be released and then assembled again. Therefore, it was difficult to manage and additional costs were incurred. In contrast, according to the exemplary embodiment of the present disclosure, the display devices 110 can be released from the wall portion 120 one-by-one by the tiling tool 100T, and thus it is not necessary to release all of the display devices 110. Specifically, the tiling tool 100T is attached to the front face of one of the display devices 110 that is to be released, and then the third magnet MG3 of the tiling tool 100T is rotated to rotate the first magnet MG1 on the rear face of the display device 110. Then, the first magnet MG1 may be rotated so that a repulsive force is formed between the first magnet MG1 and the second magnet MG2 on the wall portion, such that the display device 110 can be released from the wall portion 120. In this manner, according to the exemplary embodiment of the present disclosure, it is possible to easily release one of the display devices 110 at a time and to easily reassemble the tiled display 100. Therefore, the maintenance of the tiled display 100 including the plurality of display devices 110 can become easier or more convenient.

In addition, according to the exemplary embodiment of the present disclosure, the tiled display 100 has a mechanism for fastening the display devices 110 to the wall portion 120, so that the manufacturing cost of the tiled display 100 can be reduced. Specifically, the first magnet MG1 that is rotatable is disposed on the rear face of each of the display devices 110, and the second magnet MG2 that is movable only in the direction perpendicular to or intersecting the rear face of the display devices 110 but does not rotate is disposed on the wall portion 120. The third magnet MG3 that is rotatable is disposed in the tiling tool 100T for tiling the plurality of display devices 110 on the wall portion 120. That is to say, the first magnet MG1, the second magnet MG2, and the third magnet MG3 may be disposed in the display device 110, the wall portion 120, and the tiling tool 100T, respectively. In addition, the first magnet MG1 can be rotated by rotating the third magnet MG3 of the tiling tool 100T, such that an attractive force or a repulsive force may be formed between the rotated first magnet MG1 and the second magnet MG2 of the wall portion 120. Accordingly, the display device 110 can be easily fixed to and released from the wall portion 120. In order to fix the display device 110 to the wall portion 120, a mechanism that includes the first magnet MG1 and the second magnet MG2 is employed, instead of a complicated fastening mechanism including a variety of fastening members. Accordingly, in the tiled display 100 according to the exemplary embodiment of the present disclosure, the display devices 110 can be fixed to the wall portion 120 with the first magnets MG1 and the second magnet MG2, so that the fastening mechanism can require fewer components and the tiled display 100 can be easily manufactured.

In addition, in the tiled display 100 according to the exemplary embodiment of the present disclosure, the display devices 110 in contact with the wall portion 120 can slip gradually, so that the display devices 110 can be aligned more precisely. After an operator fixes each of the display devices 110 to the tiling tool 100T, the operator can grasp the handle 140T of the tiling tool 100T to bring the display devices 110 into contact with the wall portion 120. At this time, the display devices 1110 are in contact with the wall portion 120 but are not fixed to it, and accordingly the operator can move the display devices 110 to align them. The operator can move the display devices 110 while being in contact with the wall portion 120 to align the locations of the display devices 110. If the display devices 110 slip too easily on the wall portion 120, it may be difficult for the operator to aligned them as they may slip or move more than the operator intended. In view of the above, the second pad 146 made of a material having a low difference between a coefficient of static friction and a coefficient of dynamic friction is disposed in the second cover 140 of the wall portion 120, so that the first cover 130 on the rear face of each of display devices 110 does not slip too easily on the wall portion 120. Accordingly, according to the exemplary embodiment of the present disclosure, by disposing the second pad 146 made of a material having a low difference between a coefficient of static friction and a coefficient of dynamic friction, the display devices 110 can slip gradually on the wall portion 120 and can be aligned precisely.

In the tiled display 100 according to the exemplary embodiment of the present disclosure, it is possible to reduce an impact exerted on the display devices 110 when the display devices 110 are brought into contact with the wall portion 120. After the tiling tool 100T is attached to the display device 110, the display device 110 is moved toward the wall portion using the tiling tool 100T. In doing so, the first magnet MG1 is disposed so that a repulsive force is formed between the first magnet MG1 on the rear face of each of the display devices 110 and the second magnet MG2 on the wall portion 120, and the display devices 110 may be moved toward the wall portion 120. For example, the N-pole MG2N of the second magnet MG2 of the wall portion 120 may be disposed on a side while the S-pole MG2S thereof may be disposed on the other side. Then, the third magnet MG3 of the tiling tool 100T may be rotated so that the N-pole MG1N of the first magnet MG1 is disposed on the side and the S-pole MG1S thereof is disposed on the other side. That is to say, the display device 110 may be moved toward the wall portion 120 while the N-pole MG1N of the first magnet MG1 on the rear face of the display device 110 overlaps with the N-pole MG2N of the second magnet MG2 on the wall portion 120. If the display device 110 is moved toward the wall portion 120 while there is an attractive force between the first magnet MG1 and the second magnet MG2, the display device 110 may be attracted strongly by the attractive force and accordingly may be brought in contact with the wall portion 120 with a strong impact. Accordingly, in order to prevent the display device 110 from being brought into contact with the wall portion 120 rapidly and in turn to prevent a strong impact, the display device 110 can be moved while there is a repulsive force between the first magnet MG1 and the second magnet MG2. For this reason, in the tiled display 100 according to the exemplary embodiment of the present disclosure, the first magnet MG1 is disposed such that there is a repulsive force between the first magnet MG1 and the second magnet MG2 when the display device 110 is brought into contact with the wall portion 120. In this manner, it is possible to prevent the display device 110 from being brought into contact with the wall portion 120 with a strong impact and to prevent or reduce damage to the display device 110.

Figure 9A:
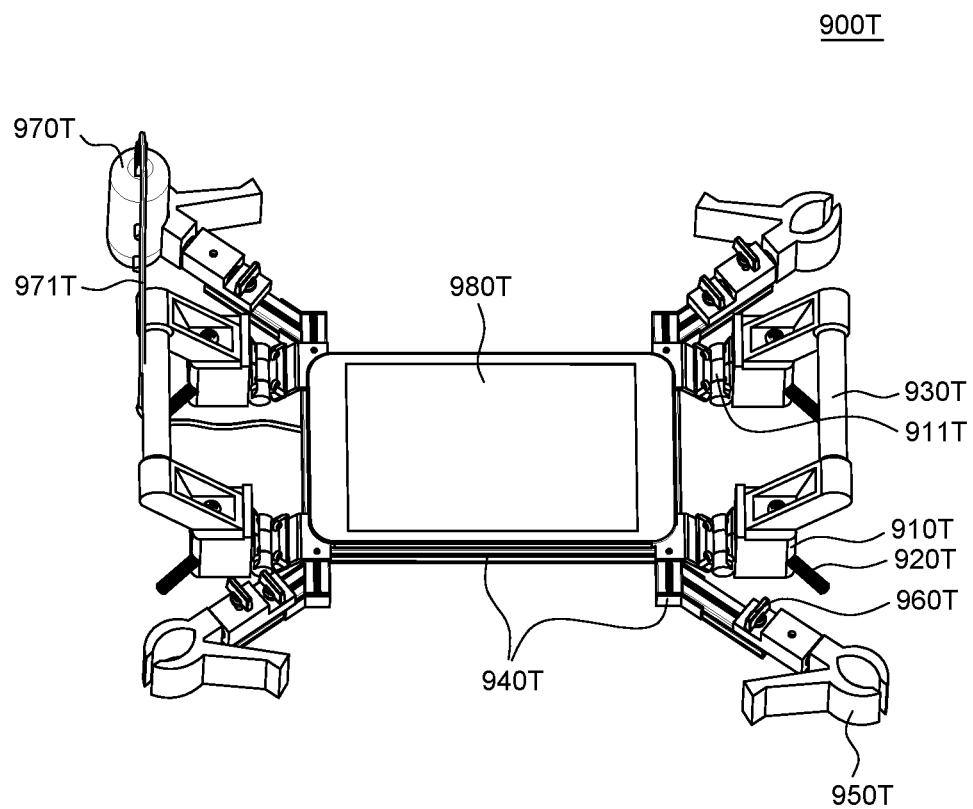
FIG. 9A is a perspective view of a tiling device according to another exemplary embodiment of the present disclosure.
Figure 9B:
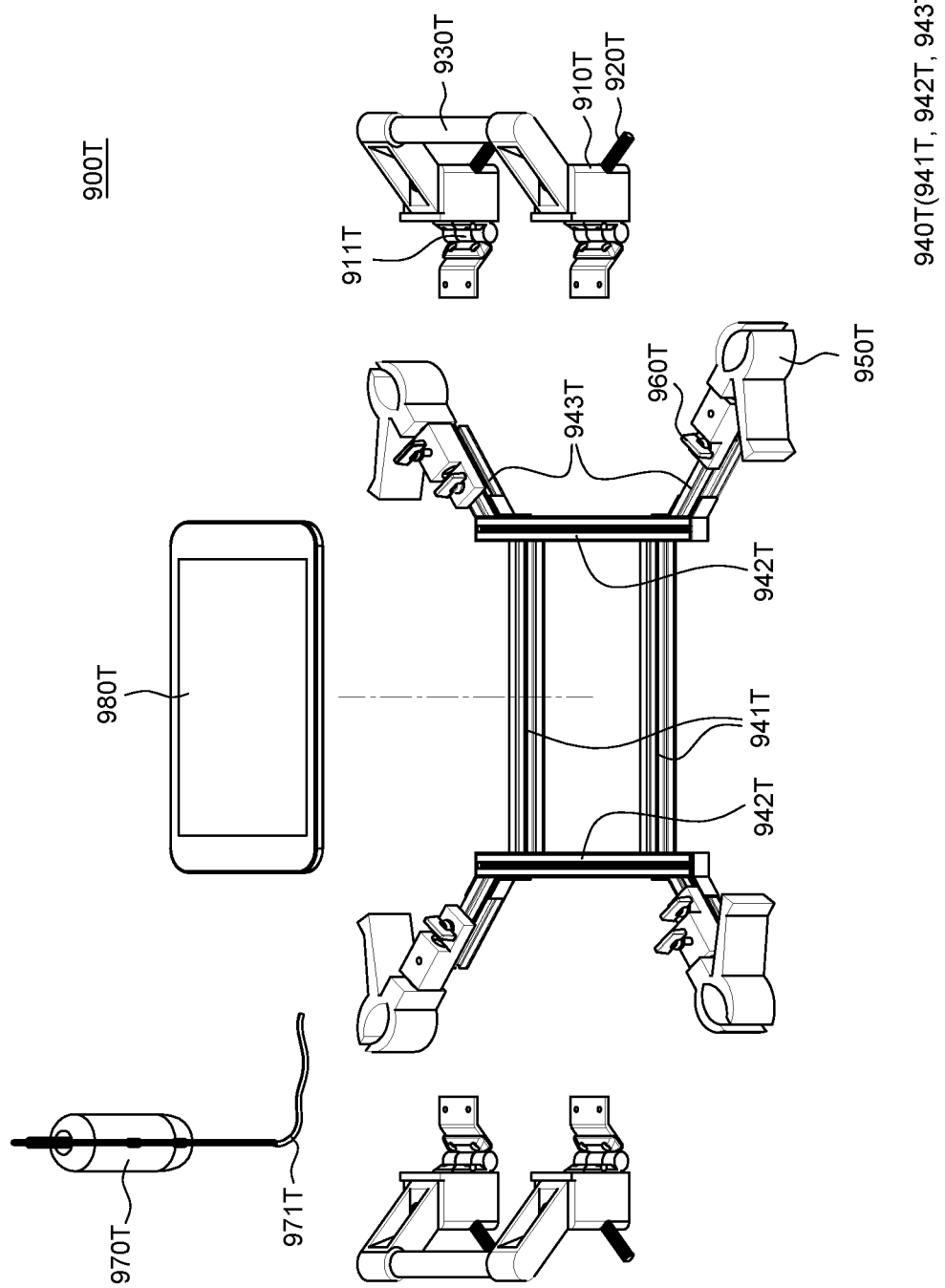
FIG. 9B is an exploded, perspective view of the tiling device according to the exemplary embodiment of the present disclosure shown in FIG. 9A.
Figure 9C:
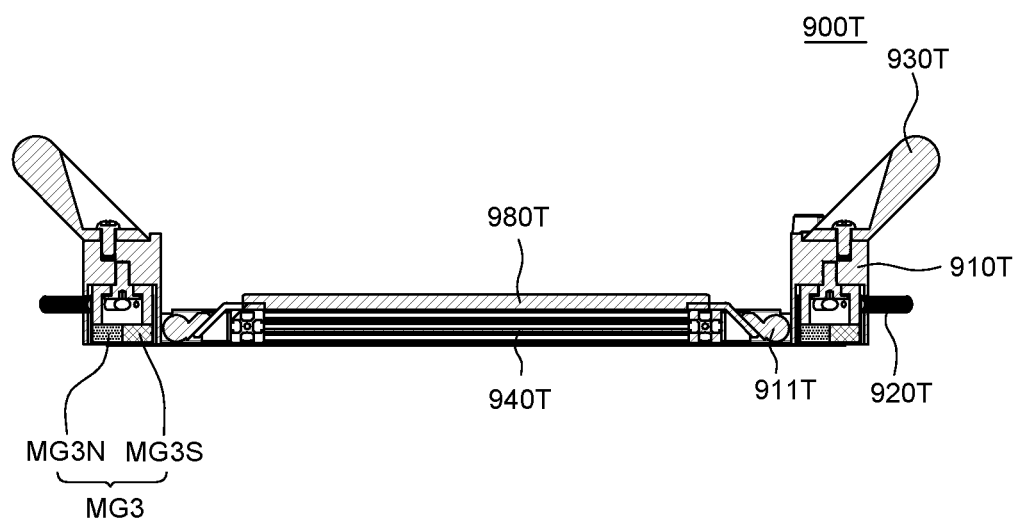
FIG. 9C is a cross-sectional view of the tiling device according to the exemplary embodiment of the present disclosure shown in FIG. 9A.

FIG. 9A is a perspective view of a tiling tool according to another exemplary embodiment of the present disclosure. FIG. 9B is an exploded, perspective view of the tiling tool according to the exemplary embodiment of the present disclosure shown in FIG. 9A. FIG. 9C is a cross-sectional view of the tiling tool according to the exemplary embodiment of the present disclosure shown in FIG. 9A. FIG. 9A is a perspective view of a tiling tool 900T according to another exemplary embodiment, attached to a portable display device 980T. Referring to FIGS. 9A-9C, a tiling tool 900T according to the exemplary embodiment of the present disclosure includes a frame 940T, a portable display device 980T, a microscope 970T, a cable 971T, a clamp 950T, a clamp fixing pin 960T, a third cover 910T, a hinge 911T, a third magnet MG3, a rotation lever 920T, and a release lever 930T.

The frame 940T is a member for supporting other elements of the tiling tool 900T. The frame 940T includes a pair of first frames 941T, a pair of second frames 942T, and a plurality of third frames 943T. The pair of first frames 941T are extended in one direction. For example, the direction may be in the same direction in which the longer sides of the portable display device 980T are extended.

The pair of second frames 942T are extended in a direction perpendicular to or intersecting the direction of the first frames 941T. For example, the pair of second frames 942T may be extended in the same direction as the direction in which the shorter sides of the portable display device 980T are extended. One of the pair of second frames 942T is connected to one end of each of the pair of first frames 941T, and the other one of the second frame 942T is connected to the other end of each of the pair of first frames 941T. Accordingly, the pair of first frames 941T and the pair of second frames 942T may form a rectangular shape and may have a shape similar to that of the portable display device 980T.

The plurality of third frames 943T may be extended to the outer side of the first frames 941T and the second frames 942T from the points where the first frames 941T meet the second frames 942T. For example, the third frames 943T may be extended toward the outer side of a rectangular shape defined by the pair of first frames 941T and the pair of second frames 942T from the four corners of the rectangular shape. In addition, the third frames 943T may be extended from the connection points of the first frames 941T and the second frames 942T toward the four corners of the portable display device 980T.

A clamp 950T and a clamp fixing pin 960T are disposed at the end of each of the plurality of third frames 943T. The clamp 950T is a member for fixing the microscope 970T. The clamp 950T may be configured to slide along the plurality of third frames 943T to thereby adjust its position.

The clamp fixing pin 960T is a member for fixing the position of the clamp 950T, e.g., after its position has been adjusted. The clamp 950T can slide from the third frame 943T or fixed to the third frame 943T by adjusting the clamp fixing pin 960T. Although the position of the clamp 950T is adjusted using the clamp fixing pin 960T in the example shown in FIGS. 9A and 9B, the present disclosure is not limited thereto.

The microscope 970T is disposed in one of the plurality of clamps 950T. The microscope 970T may be used to capture the corner positions of the plurality of display devices 110 when the display devices 110 are aligned on the wall portion 120. When the operator aligns the plurality of display devices 110, the operator can check if there are deviations in the spacing or arrangement between the display devices 110 with the microscope 970T, so that the display devices 110 can be aligned more precisely.

Although not shown in the drawings, a magnifying glass may be further disposed at another one of the plurality of clamps 950T. The operator can see the positions of the corners of the plurality of display devices 110 by using the magnifying glass, and can easily adjust deviations in the spacing and/or alignment between the display devices 110.

The portable display device 980T is disposed on the first frames 941T and the second frames 942T. The portable display device 980T can be used to check images from the microscope 970T. The operator can check the images from the microscope 970T displayed on the portable display device 980T and can adjust deviations in the spacing and/or alignment between the display devices 110. In doing so, the portable display device 980T may receive images from the microscope 970T through the cable 971T. It is, however, to be understood that the present disclosure is not limited thereto. The portable display device 980T may be connected to the microscope 970T wirelessly.

Third covers 910T for accommodating the third magnets MG3 are disposed on both sides of each of the pair of second frames 942T. For example, two third covers 910T and two third magnets MG3 may be disposed in one of the pair of second frames 942T, and two third covers 910T and two third magnets MG3 may be disposed in the other one of the pair of second frames 942T. It is to be noted that the numbers of the third magnet MG3 and the third covers 910T are not limited to those shown in FIGS. 9A to 9C. For example, the numbers of the third magnets MG3 and the third covers 910T may be equal to the number of the first magnets MG1 on the rear face of the display device 110.

Each of the plurality of third covers 910T is coupled to the respective second frames 942T via the hinge 911T. Specifically, the hinge 911T may be disposed to connect the outer side of the plurality of third covers 910T with the second frame 942T. Thus, each of the plurality of third covers 910T can rotate with respect to the pair of second frames 942T and the hinge 911T.

Referring to FIG. 9C, a third magnet MG3 is disposed inside each of the third covers 910T. The third magnet MG3 is accommodated in the third cover 910T. The third magnet MG3 is rotatable inside the third cover 910T.

The rotation lever 920T is connected to the third magnet MG3 accommodated in the third cover 110T to rotate the third magnet MG3. A part of the rotation lever 920T is inserted into the third cover 910T and connected to the third magnet MG3, and another part of the rotation lever 920T protrudes out of the third cover 910T so that an operator can rotate the rotation lever 920T by gripping the protruding part of the rotation lever 920T.

The release lever 930T is connected to the plurality of third covers 910T. For example, one release lever 930T may be connected to the third cover 910T connected to one of the second frames 942T, and another release level 930T may be connected to another third cover 910T connected to the other one of the second frames 942T.

The release lever 930T can rotate the plurality of third covers 910T to move the third magnets MG3. For example, when an operator rotates the release lever 930T disposed on the outer side of each of the pair of second frames 942T toward between the pair of second frames 942T, the third cover 910T connected to the release lever 930T can rotate together with respect to the hinge 911T. As a result, the third cover 910T can be rotated by the release lever 930T, and the third magnet MG3 accommodated in the third cover 910T can also move. The release lever 930T can serve as a knob to allow an operator to grasp the tiling tool 900T.

In the tiling tool 900T according to another exemplary embodiment, the plurality of third covers 910T and the plurality of third magnets MG3 are integrally connected to each other so that the attaching stability can be improved. Specifically, the tiling tool 900T according to the exemplary embodiment of the present disclosure includes the frame 940T, the plurality of third covers 910T, and the plurality of third magnets MG3 connected to the frame 940T. The third covers 910T and the third magnets MG3 connected to the frame 940T may be associated with the plurality of first magnets MG1 disposed on the rear face of one display device 110. Accordingly, one display device 110 can be moved and fixed to the wall portion 120 by using one tiling tool 900T. That is to say, in order to move and fix a single display device 110, each of the plurality of display devices 110 can be moved and fixed to the wall portion 120 by using a single tiling tool 900T, without using a plurality of tiling tools. Accordingly, the tiling tool 900T according to the exemplary embodiment of the present disclosure can be associated with a single display device 110, so that a single operator can easily fix each of display devices 110 to the wall portion 120, instead of requiring multiple operators.

By using the microscope 970T and the portable display device 980T of the tiling tool 900T according to another exemplary embodiment, it is possible to precisely align the plurality of display devices 110 and fix the same on the wall portion 120. The tiled display 100 including the plurality of display devices 110 may be implemented by fixing the display devices 110 to the wall portion 120. In doing so, the display devices 110 may be arranged as close to one another as possible so that the display devices 110 are perceived by a viewer as a single display device 110. By using the microscope 970T and the portable display device 980T, an operator can see an enlarged image of the boundaries between the display devices 110, so that the operator can adjust deviations in the spacing and/or alignment between the display devices 110. Accordingly, the tiling tool 900T according to the exemplary embodiment of the present disclosure allows the operator to more precisely adjust deviations in the spacing and/or alignment between the plurality of display devices 110 based on the image displayed on the portable display device 980T, and it is possible to reduce the boundaries and to improve the quality of the image displayed on the tiled display 100.

The exemplary embodiments of the present disclosure can also be described as follows:

According to an aspect of the present disclosure, there is provided a tiled display. The tiled display includes a plurality of display devices, a plurality of first magnets on the plurality of display devices, a wall portion to which the plurality of display devices are attached, and a plurality of second magnets disposed on the wall portion such that each are aligned with a corresponding one of the plurality of first magnets. The plurality of second magnets are movable in a direction perpendicular to or intersecting a surface of the wall portion.

The tiled display may further include a plurality of first covers disposed to cover the plurality of first magnets. The plurality of first magnets may be disposed between the plurality of first covers and the plurality of display devices and are configured to be rotatable therebetween.

The tiled display may further include a plurality of first pads disposed between the plurality of first covers and the plurality of first magnets and between the plurality of first magnets and the plurality of display devices.

The tiled display may further include a plurality of second covers connected to the wall portion and accommodating therein the plurality of second magnets. The plurality of second magnets may be moveable in the direction perpendicular to or intersecting the surface of the wall portion along an inner peripheral surface of the plurality of second covers.

Each of the plurality of second covers may include a first fixing portion in contact with the wall portion, a guide portion extended in the direction perpendicular to or intersecting the surface of the wall portion from the first fixing portion, a second fixing portion connected to the guide portion and disposed in parallel to or in a direction of the first fixing portion, and an anti-rotation cover fixed to the each of the plurality of second magnets and configured to be movable between the first fixing portion and the second fixing portion while being in contact with a surface of the guide portion.

The first fixing portion may be disposed in contact with the surface of the wall portion, and the second fixing portion may be disposed on sides of the surface of the wall portion, and the anti-rotation cover may have a polygonal shape to surround the plurality of second magnets, and at least a part of side surfaces of the anti-rotation cover may be in contact with the guide portion.

Each of the plurality of second covers may further include a protruding portion extended from the first fixing portion to be in contact with the wall portion, a fastener penetrating the protruding portion and the wall portion, and a second pad overlapping with the first fixing portion to be in contact with the first cover. An end of the fastener may protrude toward the plurality of first covers.

Each of the plurality of first covers may further include a guide groove receiving the end of the fastener of a corresponding one of the plurality of second covers.

The plurality of first magnets may be rotated so that N-poles of the first magnets overlap with N-poles of the plurality of second magnets when the plurality of display devices are released from the wall portion, and the plurality of second magnets may be moved toward the second fixing portion.

The plurality of first magnets may be rotated so that N-poles of the plurality of first magnets overlap with S-poles of the plurality of second magnets when the plurality of display devices are attached to the wall portion, and the plurality of second magnets may be moved toward the first fixing portion.

According to another aspect of the present disclosure, there is provided a tiling tool. The tiling tool includes a magnet, a cover accommodating the magnet therein, and a rotation lever configured to rotate the magnet. The rotation lever is configured to rotate along a circumferential direction of the cover to rotate the magnet.

The tiling tool may further include a release lever configured to move the magnet.

The release lever may be inserted into the cover and connected to the magnet, and the release lever may move along an inner circumferential surface of the cover to move the magnet.

The release lever may rotate the cover to move the magnet.

According to yet another aspect of the present disclosure, there is a method of assembling a tiled display. The method of assembling a tiled display include attaching a tiling tool accommodating a third magnet to a front face of a display device having a first magnet disposed on a rear face of the display device, attaching the tiling tool and the display device to a wall portion having a second magnet disposed therein such that an N-pole of the first magnet overlaps with an S-pole of the third magnet, and releasing the tiling tool from the front face of the display device.

The attaching the tiling tool and the display device to the wall portion may include moving the tiling tool and the display device toward the wall portion while the third magnet is rotated so that an N-pole of the second magnet overlaps with the N-pole of the first magnet, aligning a location of the display device by moving the display device on the wall portion while the display device is in contact with the wall portion, and rotating the third magnet so that the N-pole of the second magnet, an S-pole of the first magnet, and an N-pole of the third magnet overlap with one another, to fix the display device to the wall portion.

The releasing the tiling tool may include moving a release lever inserted into a cover to be connected to the third magnet so that the third magnet is moved away from the first magnet along an inner circumferential surface of the cover.

The releasing the tiling tool may include rotating a cover so that an edge of the cover in contact with the front face of the display device is moved away from the display device. The cover may rotate with respect to a hinge on an outer side surface of the cover.

The method of assembling a tiled display may further include releasing the display device from the wall portion by attaching the tiling tool to the front face of the display device, and releasing the tiling tool and the display device from the wall portion.

The attaching the tiling tool may include attaching the tiling tool to the front face of the display device so that an N-pole of the third magnet overlaps with an S-pole of the first magnet. The releasing the tiling tool and the display device may include rotating the third magnet so that the N-pole of the first magnet overlaps with an N-pole of the second magnet to release the display device having the first magnet from the wall portion having the second magnet.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A tiled display comprising:
a plurality of display devices;
a plurality of first magnets on the plurality of display device;
a wall portion to which the plurality of display devices are attached; and a plurality of second magnets on the wall portion each aligned with a corresponding one of the plurality of first magnets, wherein the plurality of second magnets are movable in a direction intersecting a surface of the wall portion, wherein when N-poles and S-poles of the plurality of first magnets overlap with S-poles and N-poles of the plurality of second magnets, respectively, the plurality of second magnets are inserted into the wall portion, and wherein when N-poles and S-poles of the plurality of first magnets overlap with N-poles and S-poles of the plurality of second magnets, respectively, the plurality of second magnets are spaced apart from the wall portion.

2. The device of claim 1, further comprising:
a plurality of first covers disposed to cover the plurality of first magnets,
wherein the plurality of first magnets are between the plurality of first covers and the plurality of display devices and configured to be rotatable therebetween.

3. The device of claim 2, further comprising: a plurality of first pads disposed between the plurality of first covers and the plurality of first magnets and between the plurality of first magnets and the plurality of display devices.

4. The device of claim 2, further comprising:
a plurality of second covers connected to the wall portion and accommodating therein the plurality of second magnets,
wherein the plurality of second magnets are moveable in the direction intersecting the surface of the wall portion along an inner peripheral surface of the plurality of second covers.

5. The device of claim 4, wherein each of the plurality of second covers comprises:
a first fixing portion in contact with the wall portion;
a guide portion extended in the direction intersecting the surface of the wall portion from the first fixing portion;
a second fixing portion connected to the guide portion and disposed in a direction of the first fixing portion; and
an anti-rotation cover fixed to the each of the plurality of second magnets and configured to be movable between the first fixing portion and the second fixing portion while being in contact with a surface of the guide portion.

6. The device of claim 5, wherein the first fixing portion is disposed in contact with the surface of the wall portion, and the second fixing portion is disposed on sides of the surface of the wall portion, and
wherein the anti-rotation cover has a polygonal shape to surround the plurality of second magnets, and at least a part of side surfaces of the anti-rotation cover is in contact with the guide portion.

7. The device of claim 5, wherein each of the plurality of second covers further comprises:
a protruding portion extended from the first fixing portion to be in contact with the wall portion;
a fastener penetrating the protruding portion and the wall portion; and
a second pad overlapping with the first fixing portion to be in contact with the first cover,
wherein an end of the fastener protrudes toward the plurality of first covers.

8. The device of claim 7, wherein each of the plurality of first covers further comprises a guide groove receiving the end of the fastener of a corresponding one of the plurality of second covers.

9. The device of claim 5, wherein the plurality of first magnets are configured to be rotated so that N-poles of the plurality of first magnets overlap with N-poles of the plurality of second magnets when the plurality of display devices are released from the wall portion, and the plurality of second magnets are configured to be moved toward the second fixing portion.

10. The device of claim 5, wherein the plurality of first magnets are configured to be rotated so that the N-poles of the plurality of first magnets overlap with the S-poles of the plurality of second magnets when the plurality of display devices are attached to the wall portion, and the plurality of second magnets are configured to be moved toward the first fixing portion.

11. A tiling tool comprising:
a magnet;
a cover accommodating the magnet therein;
a rotation lever configured to rotate the magnet; and
a release lever configured to move the magnet,
wherein the rotation lever is configured to rotate along a circumferential direction of the cover to rotate the magnet.

12. The tool of claim 11, wherein the release lever is inserted into the cover and connected to the magnet, and
wherein the release lever moves along an inner circumferential surface of the cover to move the magnet.

13. The tool of claim 11, wherein the release lever is configured to rotate the cover to move the magnet.

14. A method of assembling a tiled display, the method comprising:
attaching a tiling tool accommodating a third magnet to a front face of a display device having a first magnet disposed on a rear face of the display device;
attaching the tiling tool and the display device to a wall portion having a second magnet disposed therein such that a N-pole of the first magnet overlaps with a S-pole of the third magnet; and
releasing the tiling tool from the front face of the display device,
wherein attaching the tiling tool and the display device to the wall portion comprises:
moving the tiling tool and the display device toward the wall portion while the third magnet is rotated so that a N-pole and a S-pole of the second magnet overlap with the N-pole and a S-pole of the first magnet, respectively;
aligning a location of the display device by moving the display device on the wall portion while the display device is in contact with the wall portion; and
rotating the third magnet such that the N-pole and the S-pole of the first magnet overlap with the S-pole and the N-pole of the second magnet, respectively,
wherein when the N-pole and the S-pole of the first magnet overlap with the N-pole and the S-pole of the second magnet, respectively, the second magnet is spaced apart from the wall portion, and
wherein when the N-pole and the S-pole of the first magnet overlap with the S-pole and the N-pole of the second magnet, respectively, the second magnet is inserted into the wall portion.

15. The method of claim 14, wherein
the third magnet is rotated so that the N-pole of the second magnet, the S-pole of the first magnet, and the N-pole of the third magnet overlap with one another, to fix the display device to the wall portion.

16. The method of claim 15, wherein the releasing the tiling tool comprises moving a release lever inserted into a cover to be connected to the third magnet so that the third magnet is moved away from the first magnet along an inner circumferential surface of the cover.

17. The method of claim 15, wherein the releasing the tiling tool comprises:
    rotating a cover so that an edge of the cover in contact with the front face of the display device is moved away from the display device, and
    wherein the cover rotates with respect to a hinge on an outer side surface of the cover.

18. The method of claim 14, further comprising:
    releasing the display device from the wall portion by:
    attaching the tiling tool to the front face of the display device, and
    releasing the tiling tool and the display device from the wall portion.

19. The method of claim 18, wherein the attaching the tiling tool comprises attaching the tiling tool to the front face of the display device so that a N-pole of the third magnet overlaps with the S-pole of the first magnet, and
    wherein the releasing the tiling tool and the display device comprises rotating the third magnet so that the N-pole of the first magnet overlaps with the N-pole of the second magnet to release the display device having the first magnet from the wall portion having the second magnet.

\* \* \* \* \*